(12) United States Patent
Lee

(10) Patent No.: US 11,710,582 B2
(45) Date of Patent: Jul. 25, 2023

(54) FLEXIBLE FLAT CABLE, MANUFACTURING METHOD THEREOF AND SIGNAL TRANSMISSION DEVICE

(71) Applicant: LUXSHARE-ICT CO., LTD., Taipei (TW)

(72) Inventor: Chun-Tai Lee, Taipei (TW)

(73) Assignee: LUXSHARE-ICT CO., LTD., Taipei (TW)

( * ) Notice: Subject to any disclaimer, the term of this patent is extended or adjusted under 35 U.S.C. 154(b) by 296 days.

(21) Appl. No.: 15/930,747

(22) Filed: May 13, 2020

(65) Prior Publication Data

US 2020/0273603 A1 Aug. 27, 2020

Related U.S. Application Data

(60) Provisional application No. 62/880,678, filed on Jul. 31, 2019.

(30) Foreign Application Priority Data

Nov. 7, 2019 (TW) .................................. 108140535

(51) Int. Cl.
*H01B 7/08* (2006.01)
*H01B 7/04* (2006.01)
(Continued)

(52) U.S. Cl.
CPC .............. *H01B 7/0838* (2013.01); *B32B 3/02* (2013.01); *B32B 7/12* (2013.01); *B32B 15/08* (2013.01);
(Continued)

(58) Field of Classification Search
None
See application file for complete search history.

(56) References Cited

U.S. PATENT DOCUMENTS 3,612,744 A * 10/1971 Thomas ............... H01B 7/0838
174/117 FF
4,185,162 A * 1/1980 Bogese, II ........... H01B 7/0838
174/32
(Continued)

FOREIGN PATENT DOCUMENTS

CN  202917205 U  5/2013
CN  109585068 A  4/2019
(Continued)

OTHER PUBLICATIONS

Fukuda—JP 2013-140716 A—sister of CN D1—Bib+MT-Google—shielded flat cable—2013 (Year: 2013).*
(Continued)

*Primary Examiner* — John Vincent Lawler
(74) *Attorney, Agent, or Firm* — Birch, Stewart, Kolasch & Birch, LLP

(57) ABSTRACT

A flexible flat cable (FFC) includes a first insulation layer, at least one pair of conductors, a plurality of low-k dielectric layers, two second insulation layers, and at least one shielding layer. The pair of conductors is located within the first insulation layer. Each pair of conductors includes a plurality of first conductors, and the first conductors are axially extending and arranged in parallel. The low-k dielectric layers are embedded in the first insulation layer. Each of the pair of conductors or each of the first conductors is covered and surrounded with one low-k dielectric layer. The two second insulation layers are located on two surfaces of the first insulation layer. The shielding layer is located on the two second insulation layers opposite to the first insulation layer.

17 Claims, 26 Drawing Sheets

(51) Int. Cl.
*H05K 9/00* (2006.01)
*H01B 13/00* (2006.01)
*H01B 13/22* (2006.01)
*B32B 3/02* (2006.01)
*B32B 37/02* (2006.01)
*B32B 7/12* (2006.01)
*B32B 15/08* (2006.01)
*B32B 15/20* (2006.01)
*H01R 12/77* (2011.01)

(52) U.S. Cl.
CPC .............. *B32B 15/20* (2013.01); *B32B 37/02* (2013.01); *H01B 7/04* (2013.01); *H01B 13/0036* (2013.01); *H01B 13/22* (2013.01); *H01R 12/77* (2013.01); *H05K 9/0088* (2013.01); *H05K 9/0098* (2013.01); *B32B 2250/40* (2013.01); *B32B 2260/02* (2013.01); *B32B 2307/202* (2013.01); *B32B 2307/204* (2013.01); *B32B 2307/206* (2013.01); *B32B 2311/04* (2013.01); *B32B 2311/12* (2013.01); *B32B 2311/16* (2013.01); *B32B 2311/22* (2013.01); *B32B 2311/24* (2013.01); *B32B 2457/08* (2013.01)

(56) References Cited

U.S. PATENT DOCUMENTS

| | | | | |
|---|---|---|---|---|
| 4,287,385 A | * | 9/1981 | Dombrowsky | H01B 7/0838 174/105 R |
| 4,468,089 A | * | 8/1984 | Brorein | H01B 7/0838 385/101 |
| 4,475,006 A | * | 10/1984 | Olyphant, Jr. | H01B 7/0861 174/105 R |
| 5,003,126 A | * | 3/1991 | Fujii | G02B 6/4403 174/117 FF |
| 5,084,594 A | * | 1/1992 | Cady | H01B 7/0892 174/117 M |
| 5,900,588 A | * | 5/1999 | Springer | H01B 7/0861 174/117 F |
| 6,300,846 B1 | * | 10/2001 | Brunker | H05K 1/0228 174/33 |
| 7,612,290 B1 | | 11/2009 | Le | |
| 8,338,709 B2 | * | 12/2012 | Kodama | H01B 7/0838 174/117 FF |
| 10,164,311 B2 | | 12/2018 | Lee et al. | |
| 2009/0126972 A1 | * | 5/2009 | Matsushita | H01B 7/0861 174/113 R |
| 2012/0199376 A1 | * | 8/2012 | Konya | H01B 7/0869 174/117 F |
| 2013/0043058 A1 | * | 2/2013 | Shanai | H01B 7/295 428/354 |
| 2013/0161057 A1 | * | 6/2013 | Konya | H01B 7/0838 174/102 R |
| 2013/0277088 A1 | * | 10/2013 | Gundel | H01B 7/02 174/107 |
| 2014/0090883 A1 | * | 4/2014 | Gundel | H01B 11/1895 174/102 R |
| 2018/0053981 A1 | | 2/2018 | Bae et al. | |

FOREIGN PATENT DOCUMENTS

| | | | | |
|---|---|---|---|---|
| EP | 2487694 A1 | * | 8/2012 | .......... C08L 23/0869 |
| JP | 4066725 B2 | | 3/2008 | |
| JP | 2008/198592 | * | 8/2008 | .......... C08L 23/0869 |
| JP | 2013/140716 | * | 7/2013 | .............. H01B 7/08 |
| JP | 5247956 B2 | | 7/2013 | |
| TW | 201209854 A1 | | 3/2012 | |
| TW | M492509 U | | 12/2014 | |
| TW | M530461 | * | 10/2016 | .............. H01B 7/08 |
| TW | M536407 U | | 2/2017 | |
| TW | I583277 B | | 5/2017 | |
| TW | M570520 U | | 11/2018 | |

OTHER PUBLICATIONS

Chin—TW M530461 U—CN D2—Bib-MT-Google—flexible flat cable structure—2016 (Year: 2016).*

Gerpheide—Reliability & econ various shielding flat cables—polyester adhesive w-163C+motive—IEEE 1971 EIC Electr.Insul. Conf.—1971 (Year: 1971).*

Hedrick—high-temp polyimide nanofoams for microelectronic applications—React.Func.Polymers—1996 (Year: 1996).*

Nakamura—JP 2008-198592 A—MT—flat cable w-multiple layers—2008 (Year: 2008).*

* cited by examiner

FLEXIBLE FLAT CABLE, MANUFACTURING METHOD THEREOF AND SIGNAL TRANSMISSION DEVICE

CROSS-REFERENCES TO RELATED APPLICATIONS

This application claims the priority benefit of U.S. provisional application Ser. No. 62/880,678, filed on Jul. 31, 2019 and Patent Application No. 108140535 filed in Taiwan, R.O.C. on Nov. 7, 2019. The entirety of the above-mentioned patent applications are hereby incorporated by references herein and made a part of the specification.

BACKGROUND

Technical Field

The present invention relates to a high-speed signal transmission line and a manufacturing method thereof, and especially, to a flexible flat cable (FFC), a manufacturing method thereof and a signal transmission device.

Related Art

A flexible flat cable (FFC) is a high-precision cable product used for signal transmission, and has advantages such as being bendable at will and high-speed signal transmission. The FFC can be simply and flexibly applied to signal transmission of various electronic products, and therefore widely applied to many fields. The FFC herein may be used in combination with an electronic connector or may be directly soldered on a printed circuit board (PCB), to transmit signals from one end of the FFC to the other end, thereby achieving an objective of signal transmission.

A conventional FFC is manufactured by adopting a lamination process. In other words, by heating and pressurizing upper and lower insulation films, hot melt adhesives, adjacent to respective sides of a conductor, of the insulation films are fused with each other and clamp the conductor between the films, to form a flattened FFC.

SUMMARY

However, in the lamination process, the hot melt adhesives on the upper and lower sides of the conductor may flow, leading to non-uniformity of the hot melt adhesive around the conductor. Consequently, a dielectric layer is not stable, and high-frequency signal transmission is further greatly affected, and for example, quality of signals is reduced. Moreover, a pitch between conductors (the shortest distance between two center points of two adjacent conductors) is maintained in dependence on a guide bar in the process. As a result, a size of the pitch may fluctuate with the stability of the process, to affect the quality of high-frequency signal transmission. In addition, the insulation films are made, through a coating process, of a material having a relatively high dielectric constant, and as a result, the quality of the high-frequency signal transmission of the clamped conductor is affected.

In an embodiment, an FFC includes a first insulation layer, at least one pair of conductors, a plurality of low-k dielectric layers, two second insulation layers, and at least one shielding layer. The pair of conductors is located within the first insulation layer. Each pair of conductors includes a plurality of first conductors, and the first conductors are axially extending and arranged in parallel. The low-k dielectric layers are embedded in the first insulation layer. Each of the pair of conductors or each of the first conductors is covered and surrounded with one low-k dielectric layer. The two second insulation layers are located on two surfaces of the first insulation layer. The shielding layer is located on the two second insulation layers opposite to the first insulation layer.

In another embodiment, an FFC includes a first insulation layer, at least one pair of conductors, a plurality of low-k dielectric layers, two external dielectric layers, and two metal layers. The pair of conductors is located within the first insulation layer. Each pair of conductors includes a plurality of first conductors, and the first conductors are longitudinally extending and arranged in parallel. The low-k dielectric layers are embedded in the first insulation layer. Each of the pair of conductors or each of the first conductors is covered and surrounded with one low-k dielectric layer. The two external dielectric layers are respectively located on two surfaces of the first insulation layer. The two metal layers are respectively located on the two external dielectric layers opposite to the first insulation layer.

In an embodiment, a signal transmission device includes the FFC described above and an electrical connection component. The electrical connection component is coupled to one end of the FFC.

In an embodiment, a manufacturing method for an FFC includes: arranging at least one pair of conductors in parallel between two insulation films, where each pair of conductors is covered by a low-k dielectric layer; laminating the two insulation films into one insulation layer, where each pair of conductors covered by the low-k dielectric layer is embedded in the insulation layer; and laminating at least one shielding layer on two surfaces of the insulation layer.

In another embodiment, a manufacturing method for an FFC includes: arranging at least one pair of conductors in parallel between two insulation films, where each pair of conductors includes a plurality of conductors, and each conductor is covered by a low-k dielectric layer; laminating the two insulation films into one insulation layer, where each pair of conductors covered by the low-k dielectric layer is embedded in the insulation layer; and laminating at least one shielding layer on two surfaces of the insulation layer.

In still another embodiment, a manufacturing method for an FFC includes: arranging at least one pair of conductors between two insulating-shielding films in parallel, where each pair of conductors is covered by a low-k dielectric layer, and each insulating-shielding film includes a metal layer, an external dielectric layer located on the metal layer and adjacent to the pair of conductors, and a hot melt insulation layer located on the external dielectric layer and adjacent to the pair of conductors; and laminating the two insulating-shielding films into one insulating-shielding layer, where each pair of conductors covered by the low-k dielectric layer is embedded in the insulating-shielding layer.

In still another embodiment, a manufacturing method for an FFC includes: arranging at least one pair of conductors between two insulating-shielding films in parallel, where each pair of conductors includes a plurality of conductors, each conductor is covered by a low-k dielectric layer, and each insulating-shielding film includes a metal layer, an external dielectric layer located on the metal layer and adjacent to the pair of conductors, and a hot melt insulation layer located on the external dielectric layer and adjacent to the pair of conductors; and laminating the two insulating-shielding films into one insulating-shielding layer, where each pair of conductors covered by the low-k dielectric layer is embedded in the insulating-shielding layer.

Based on above, according to the FFC, the manufacturing method thereof, and the signal transmission device of the present invention, a conductor clamped in an insulation layer (that is, the first insulation layer) is covered by a layer of low-k material (that is, the low-k dielectric layer), to prevent a high-k material from affecting the signal transmission, to further improve quality of high-speed signal transmission relatively. In addition, according to the embodiments of the present invention, the process is convenient and low in cost.

BRIEF DESCRIPTION OF THE DRAWINGS

FIG. 4 is a schematic diagram of a cross section along a cutting line II-II in

FIG. 3;

DETAILED DESCRIPTION

Figure 1:
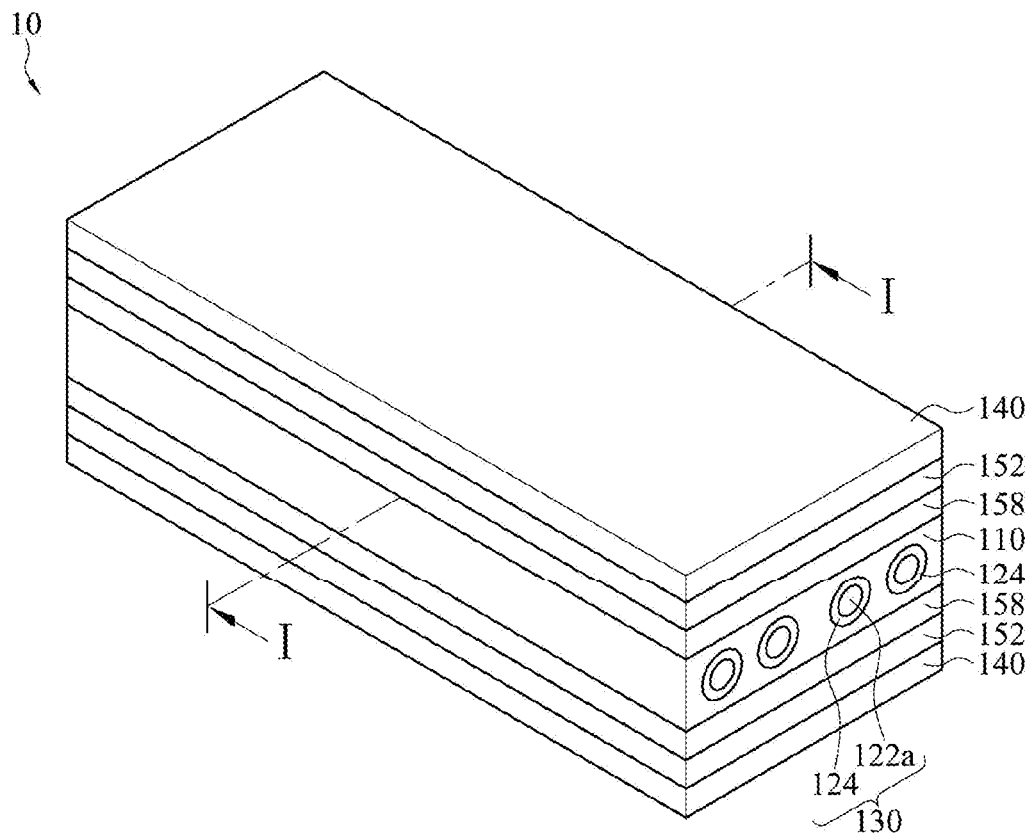
FIG. 1 is a schematic diagram of a first embodiment of a flexible flat cable.

In some embodiments, referring to FIG. 1 to FIG. 4, a flexible flat cable (FFC) 10 includes a first insulation layer 110, at least one pair of conductors 122, a plurality of low-k dielectric layers 124, two metal layers 152, and two external dielectric layers 158.

Herein, each pair of conductors 122 includes two adjacent conductors (referred to as first conductors 122a below). The first conductors 122a longitudinally extend and are disposed in parallel. In other words, each of the first conductors 122a extends along a first direction, and the first conductors 122a are arranged in parallel along a second direction. The first direction is approximately perpendicular to the second direction.

Figure 2:
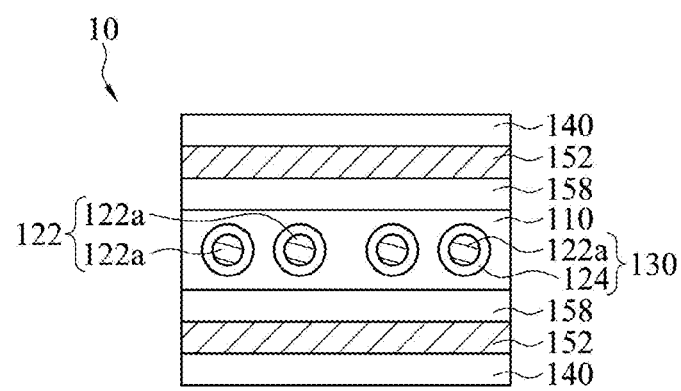
FIG. 2 is a schematic diagram of a cross section along a cutting line I-I in FIG. 1.

In an embodiment, as shown in FIG. 1 and FIG. 2, the first conductors 122a are respectively covered by the low-k dielectric layers 124. In other words, a surface, surrounding the axis, of each first conductor 122a is covered by a low-k dielectric layer 124, to form conductors 130 with a jacket. In addition, the conductors 130 with a jacket are embedded in the first insulation layer 110. In an example, the conductors 130 with a jacket are arranged at intervals between each other. In other words, there is a gap between two adjacent conductors 130 with a jacket.

Figure 3:
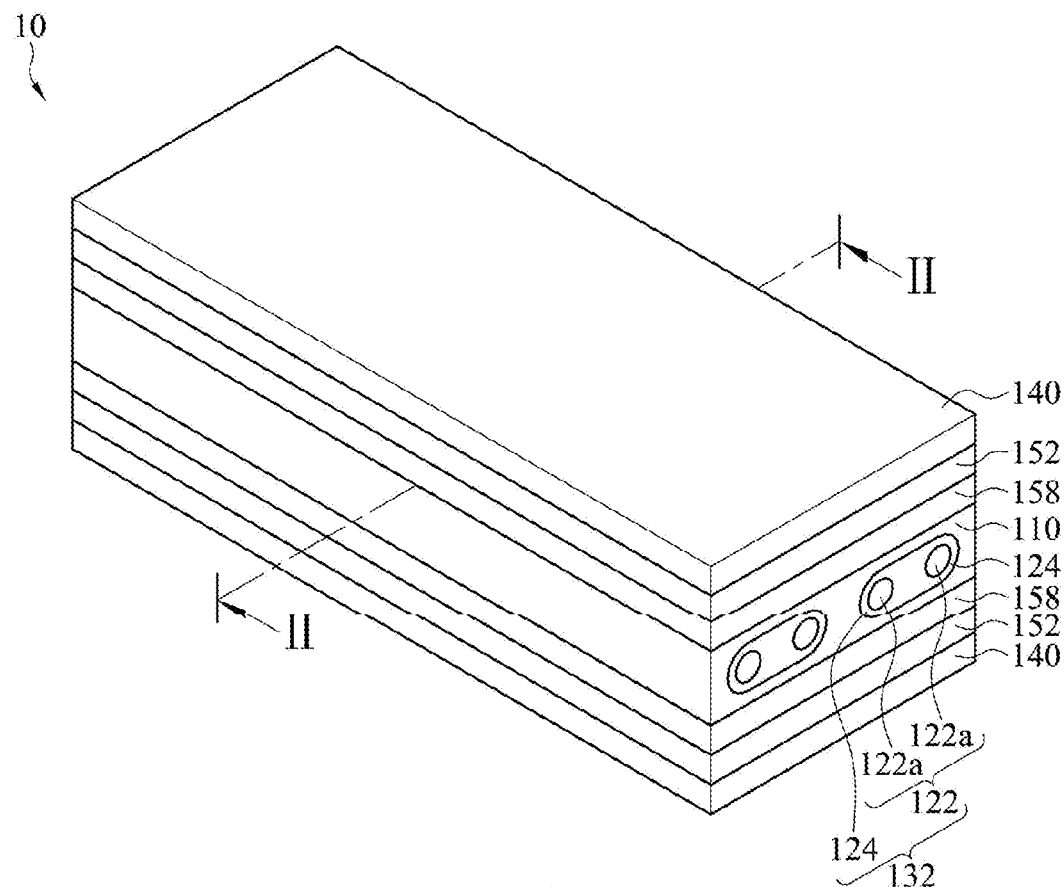
FIG. 3 is a schematic diagram of a second embodiment of a flexible flat cable.
Figure 4:
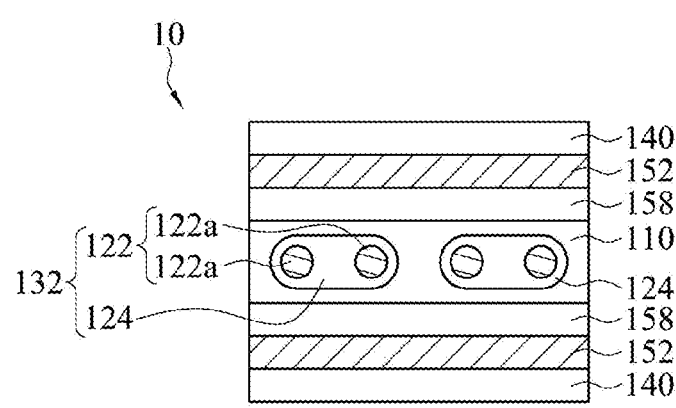
Figure 5:
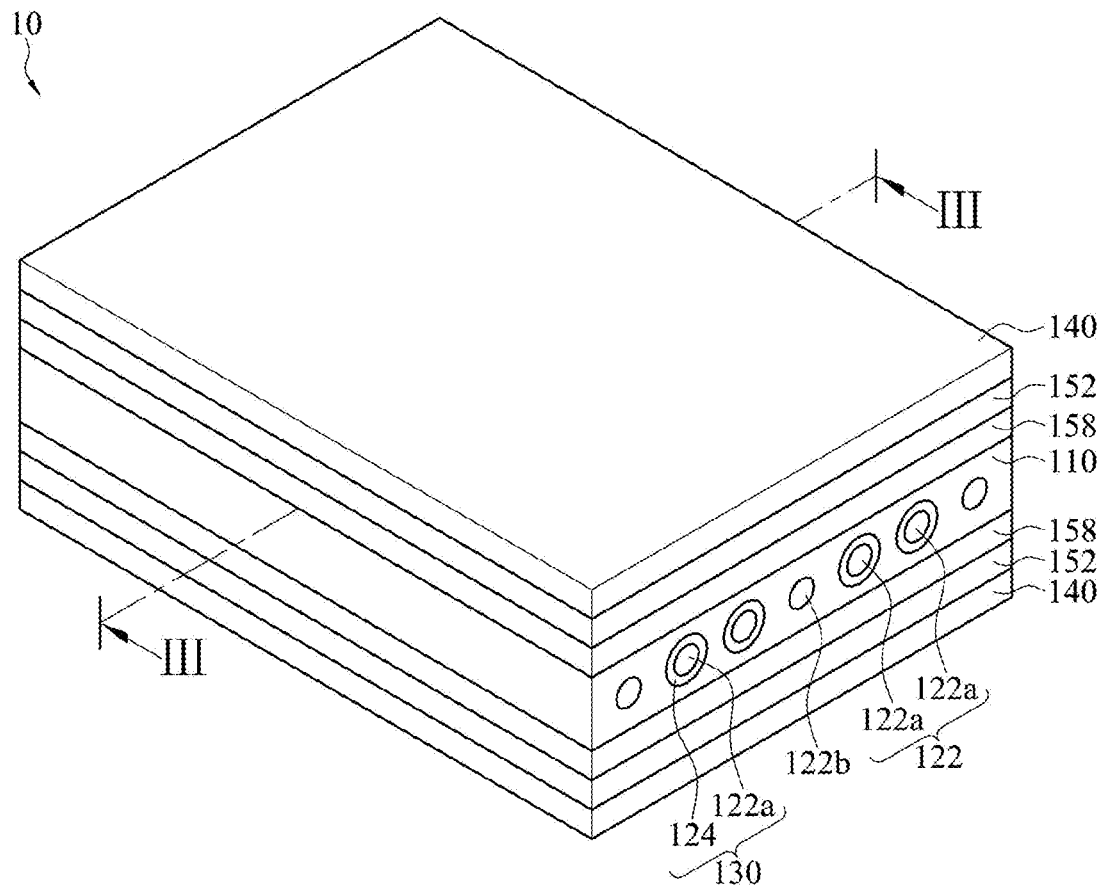
FIG. 5 is a schematic diagram of a third embodiment of a flexible flat cable.
Figure 6:
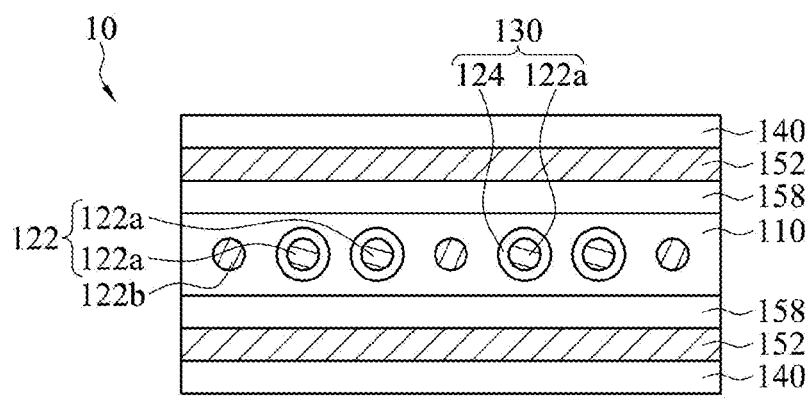
FIG. 6 is a schematic diagram of a cross section along a cutting line III-III in FIG. 5.
Figure 7:
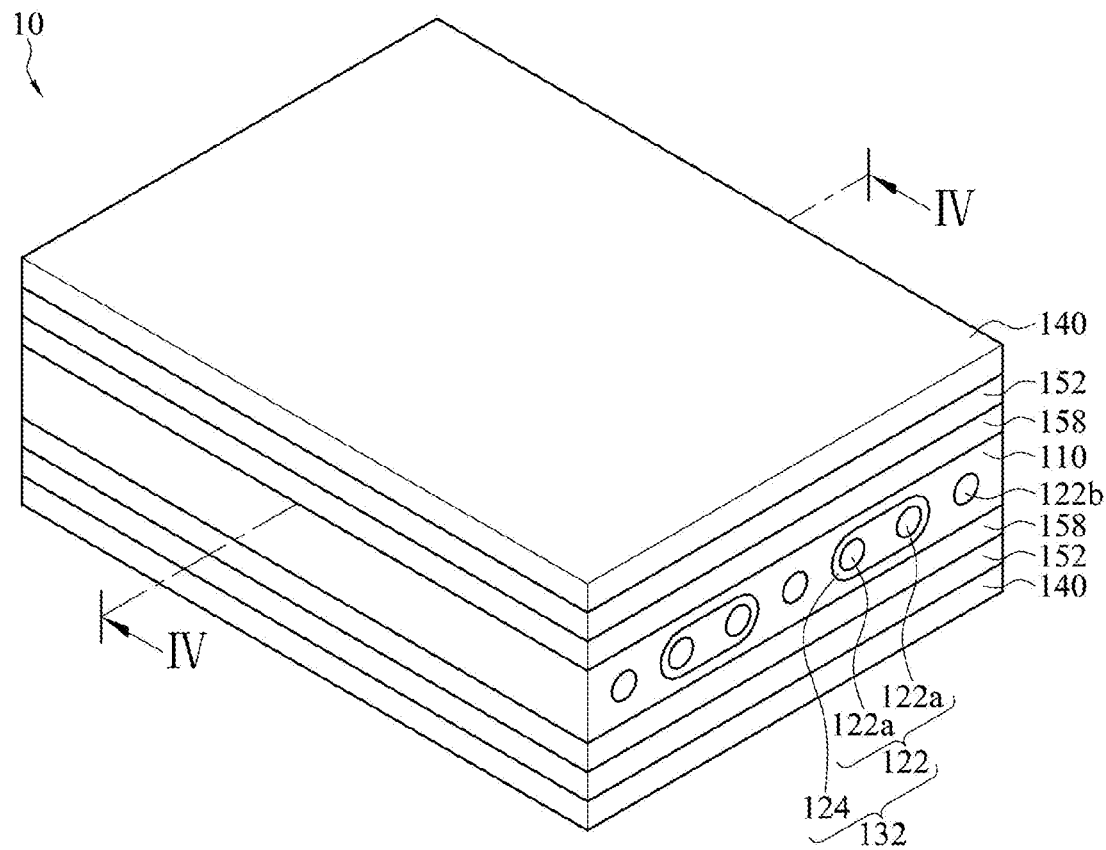
FIG. 7 is a schematic diagram of a fourth embodiment of a flexible flat cable.
Figure 8:
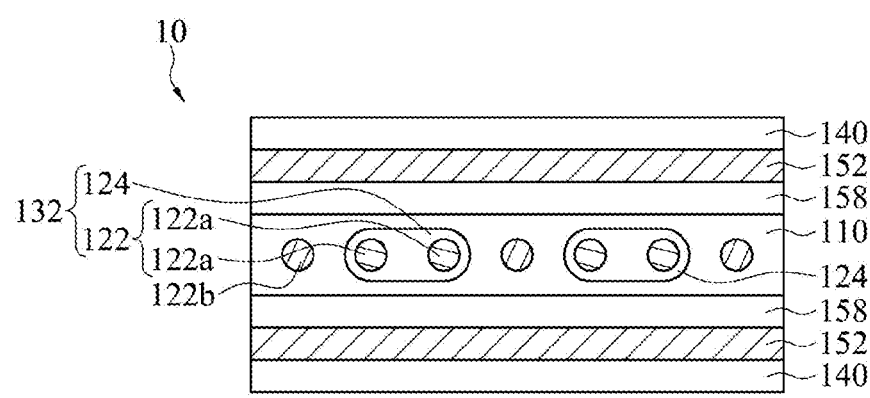
FIG. 8 is a schematic diagram of a cross section along a cutting line IV-IV in FIG. 7.

In another embodiment, as shown in FIG. 3 and FIG. 4, the pairs of conductors 122 are respectively covered by the low-k dielectric layers 124. In other words, each pair of conductors 122 is covered by a low-k dielectric layer 124, to form a pair of conductors 132 with a jacket. In addition, conductors 130 of the pairs of conductors 132 with a jacket are embedded in the first insulation layer 110. In an example, the low-k dielectric layers 124 extend longitudinally, are parallel to each other and are arranged at intervals. Each pair of conductors 122 is embedded in a corresponding low-k dielectric layer 124. In other words, there is a gap between two adjacent pairs of conductors 132 with a jacket.

Referring to FIG. 1 to FIG. 4 again, the two external dielectric layers 158 are respectively located on two surfaces of the first insulation layer 110. The two metal layers 152 are respectively located on the two external dielectric layers 158 opposite to the first insulation layer 110.

In some embodiments, the first insulation layer 110, the external dielectric layers 158, and the metal layers 152 may be implemented by using two insulating-shielding films. For example, the insulating-shielding films may be insulating-shielding tapes. For example, one part of the first insulation layer 110, one external dielectric layer 158, and one metal layer 152 form one tape, and the other part of the first insulation layer 110, the other external dielectric layer 158, and the other metal layer 152 form the other tape. In other words, outermost layers of the FFC 10 are the metal layers 152.

In some embodiments, the FFC 10 may further include two second insulation layers 140. The two second insulation layers 140 are respectively located on the two metal layers 152 opposite to the two external dielectric layers 158.

In some embodiments, the first insulation layer 110, the external dielectric layers 158, the metal layers 152, and the second insulation layers 140 may be implemented by using two insulating-shielding films. For example, the insulating-shielding films may be insulating-shielding tapes. For example, one part of the first insulation layer 110, one external dielectric layer 158, one metal layer 152, and one second insulation layer 140 form one tape, and the other part of the first insulation layer 110, the other external dielectric layer 158, the other metal layer 152, and the other second insulation layer 140 form the other tape. In other words, outermost layers of the FFC 10 are the second insulation layers 140, to protect the internal structure.

In some embodiments, as shown in FIG. 5 to FIG. 8, the FFC 10 may further include at least one conductor (a second conductor 122b) that is not covered or surrounded by a low-k dielectric layer 124, that is, a conductor with no jacket. The second conductor 122b axially extends and is arranged in parallel with the pairs of conductors 122. The second conductor 122b is directly embedded in the first insulation layer 110. The pairs of conductors 122 and the second conductors 122b are arranged at intervals and in a way that their lateral positions are switched one for the other. In some embodiments, viewed from a cross section of the FFC 10, two conductors that are closest to two side edges of the FFC 10 are the second conductors 122b, that is, conductors with no jacket.

In some embodiments, the metal layer 152 may be a metal foil or a metal coating. In some embodiments, the metal layer 152 may be formed on a surface of the second insulation layer 140 by means of dry lamination, wet lamination, or evaporation.

In some embodiments, the external dielectric layer 158 may be formed on a surface, adjacent to the first insulation layer 110, of the metal layer 152 by means of dry lamination, wet lamination, or coating, that is, on a surface of the other side, opposite to the second insulation layer 140, of the metal layer 152.

In some embodiments, the first insulation layer 110 is hot melt. In some embodiments, the first insulation layer 110 may be formed on a surface of the external dielectric layer 158 by means of wet lamination or coating.

Figure 9:
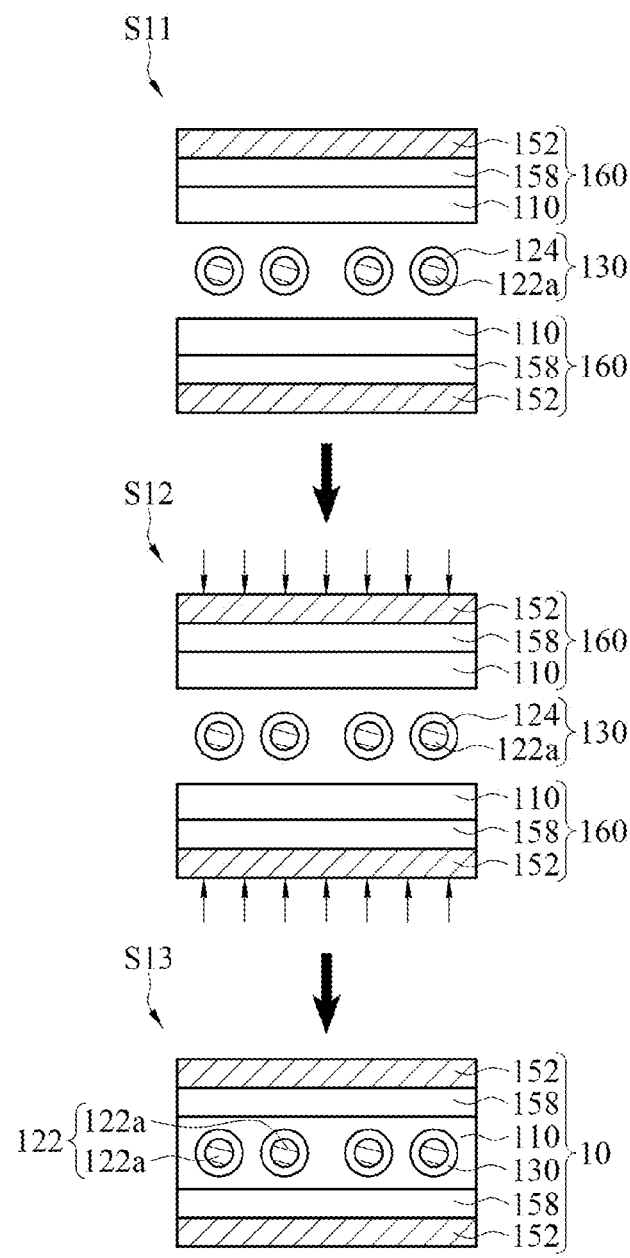
FIG. 9 is a flowchart of a first embodiment of a manufacturing method for a flexible flat cable.
Figure 10:
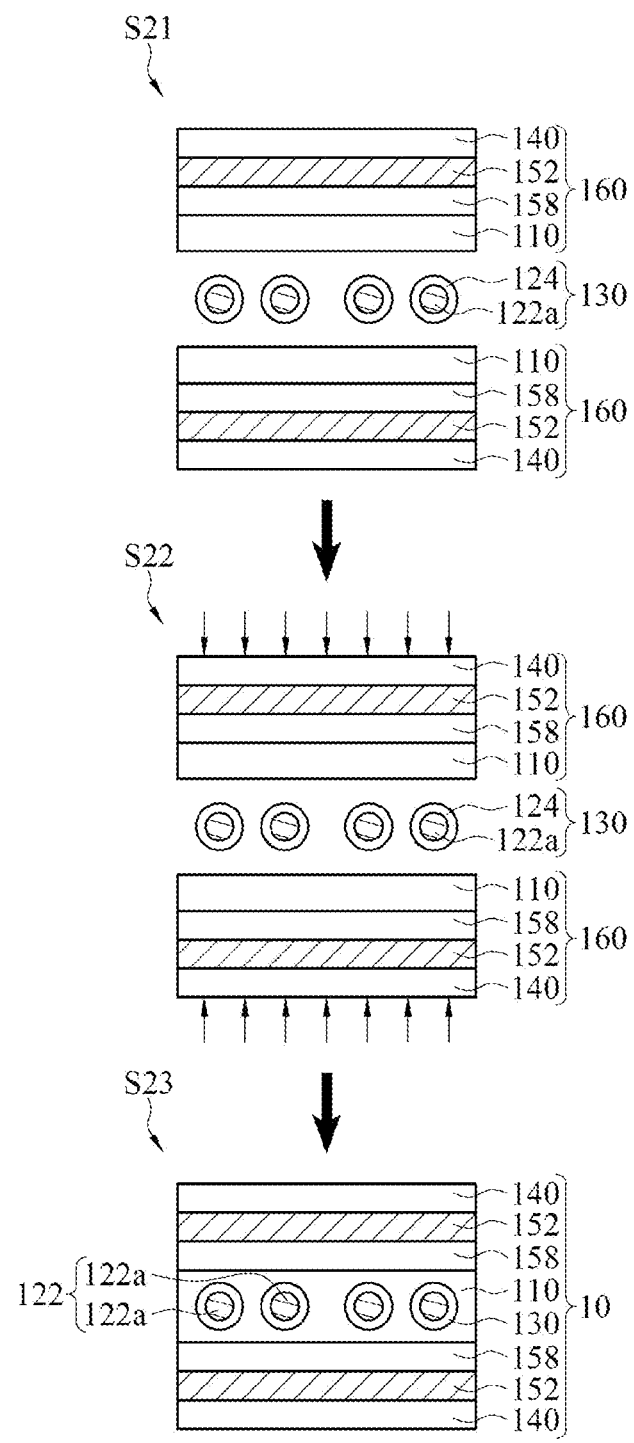
FIG. 10 is a flowchart of a second embodiment of a manufacturing method for a flexible flat cable.

In some embodiments, referring to FIG. 9 and FIG. 10, a manufacturing method for an FFC 10 is as follows: first, at least one pair of conductors 122 (that is, a plurality of conductors 130 with a jacket or at least one pair of conductors (132, not shown) with a jacket) is arranged in parallel between two insulating-shielding films 160 (step S11 or S21). In an embodiment, as shown in FIG. 9, each insulating-shielding film 160 includes a metal layer 152, an external dielectric layer 158 located on the metal layer 152 and adjacent to at least one pair of conductors 122, and a hot melt insulation layer (that is, a part of a first insulation layer 110) located on the external dielectric layer 158 and adjacent to the at least one pair of conductors 122. In an embodiment, as shown in FIG. 10, each insulating-shielding film 160 includes a second insulation layer 140, a metal layer 152, an external dielectric layer 158 located on the metal layer 152 and adjacent to at least one pair of conductors 122, and a hot melt insulation layer (that is, a part of a first insulation layer 110) located on the external dielectric layer 158 and adjacent to the at least one pair of conductors 122.

After step S11 or S21, the two insulating-shielding films 160 are laminated into one insulating-shielding layer (step S12 or S22), and the conductor 130 with a jacket or the pair of conductors 132 with a jacket is embedded in the insulating-shielding layer, to form an FFC (step S13 or S23). In an example, hot melt first insulation layers 110 are located on sides, adjacent to the conductors 122a, of the two insulating-shielding films 160. Therefore, in the lamination step (step S11 or S21), the first insulation layers 110 of the two insulating-shielding films 160 may be fused into one layer due to lamination, and the conductor 130 with a jacket or the pair of conductors 132 with a jacket (and the conductor 122b with no jacket, not shown) is embedded in the layer.

Figure 11:
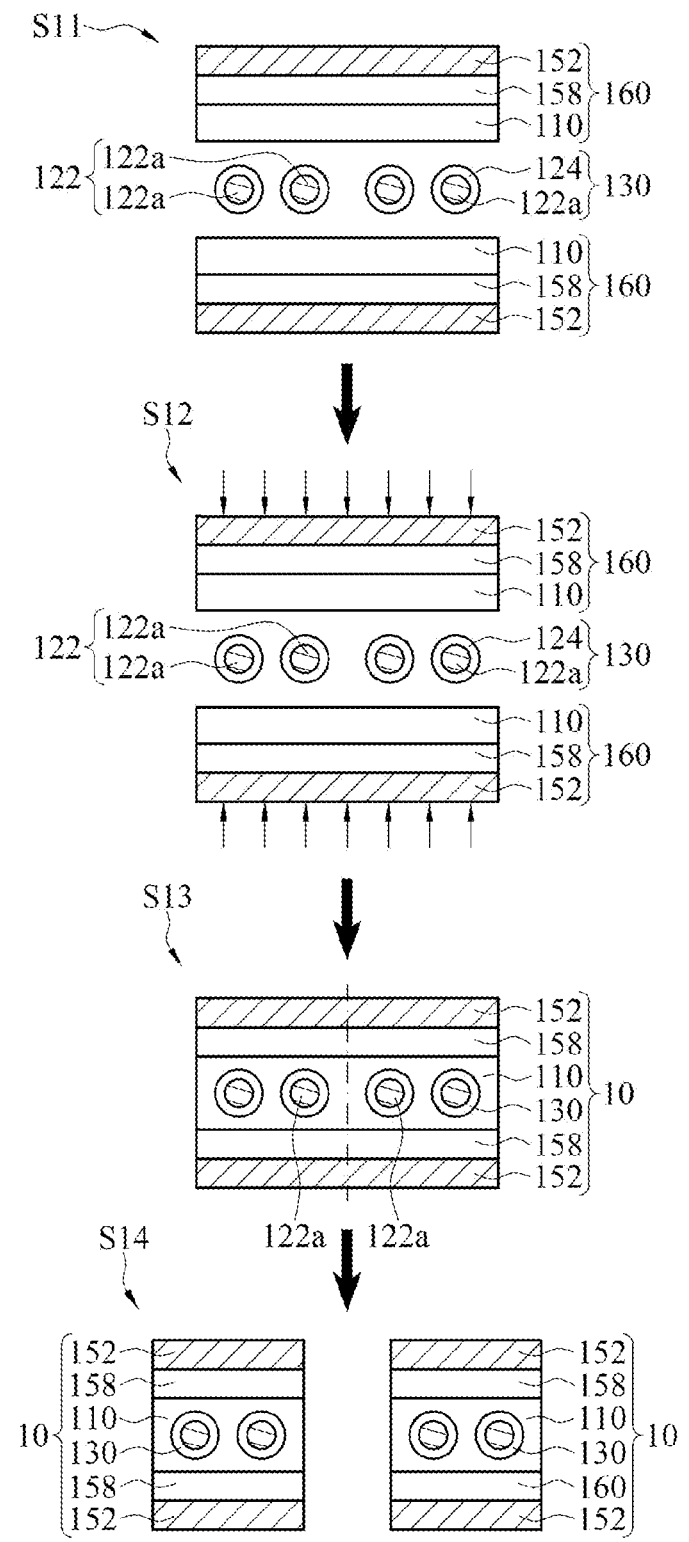
FIG. 11 is a flowchart of a third embodiment of a manufacturing method for a flexible flat cable.
Figure 12:
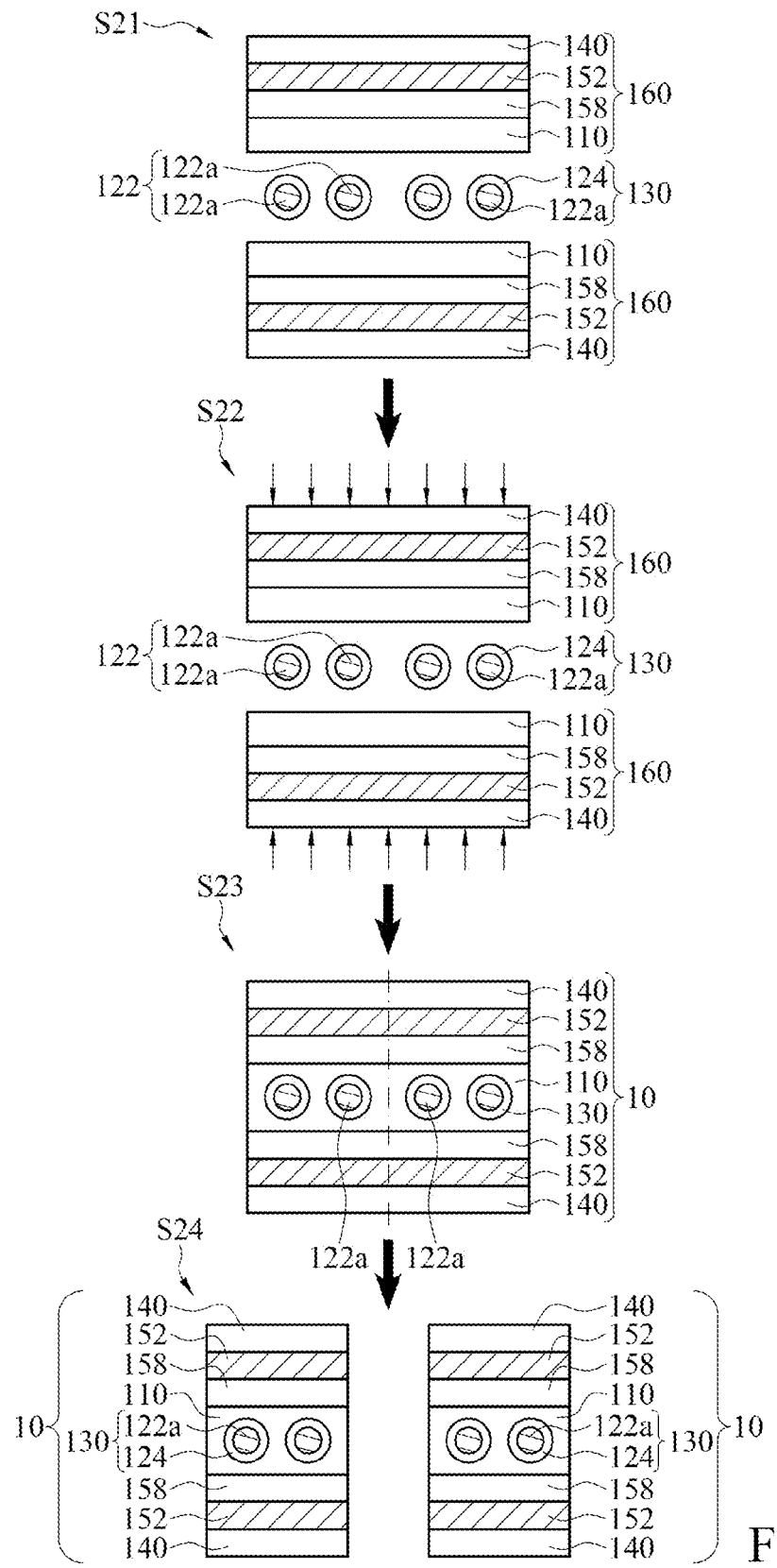
FIG. 12 is a flowchart of a fourth embodiment of a manufacturing method for a flexible flat cable.

In some embodiments, as shown in FIG. 11 and FIG. 12, a large block of FFC including a large quantity of pairs of conductors 122, that is, a plurality of FFCs 10 coupled to each other at edges (that is, side edges extending along the conductors 122a), may be formed at a time based on steps S11 to S13 or S21 to S23, and then cutting (that is, cutting off two adjacent conductors 122a) is performed according to the quantity of conductors 122a (and conductors 122b with no jacket, not shown) required by each FFC 10 to split the large block of FFC into a plurality of FFCs 10 (step S13 or S23).

In some embodiments, before step S11 or S21, the insulating-shielding films 160 may be formed in advance.

In an example, a step of forming the insulating-shielding film 160 includes: forming the external dielectric layer 158 on the surface of the metal layer 152 by means of dry lamination, wet lamination, or coating, and forming the first insulation layer 110 on the surface of the other side, opposite to the metal layer 152, of the external dielectric layer 158 by means of wet lamination or coating. The first insulation layer 110 is made of a hot melt material.

In another example, a step of forming the insulating-shielding film 160 includes: forming the metal layer 152 on the surface of the second insulation layer 140 by means of dry lamination, wet lamination, or evaporation, forming the external dielectric layer 158 on the surface of the other side, opposite to the second insulation layer 140, of the metal layer 152 by means of dry lamination, wet lamination, or coating, and forming the first insulation layer 110 on the surface of the other side, opposite to the metal layer 152, of the external dielectric layer 158 by means of wet lamination or coating. The first insulation layer 110 is made of a hot melt material.

If the metal layer 152 is formed by means of dry lamination or wet lamination, the metal layer 152 may be a metal foil. If the metal layer 152 is formed by means of evaporation, the metal layer 152 may be a metal coating.

In some embodiments, referring to FIG. 13 to FIG. 18, an FFC 10 includes a first insulation layer 110, at least one pair of conductors 122, a plurality of low-k dielectric layers 124, two second insulation layers 140, and at least one shielding layer 150. Each shielding layer 150 is multi-layered.

Herein, each pair of conductors 122 includes two first conductors 122a. The first conductors 122a longitudinally extend and are disposed in parallel. In other words, each of the first conductors 122a extends along a first direction, and the first conductors 122a are arranged in parallel along a second direction. The first direction is approximately perpendicular to the second direction.

Figure 13:
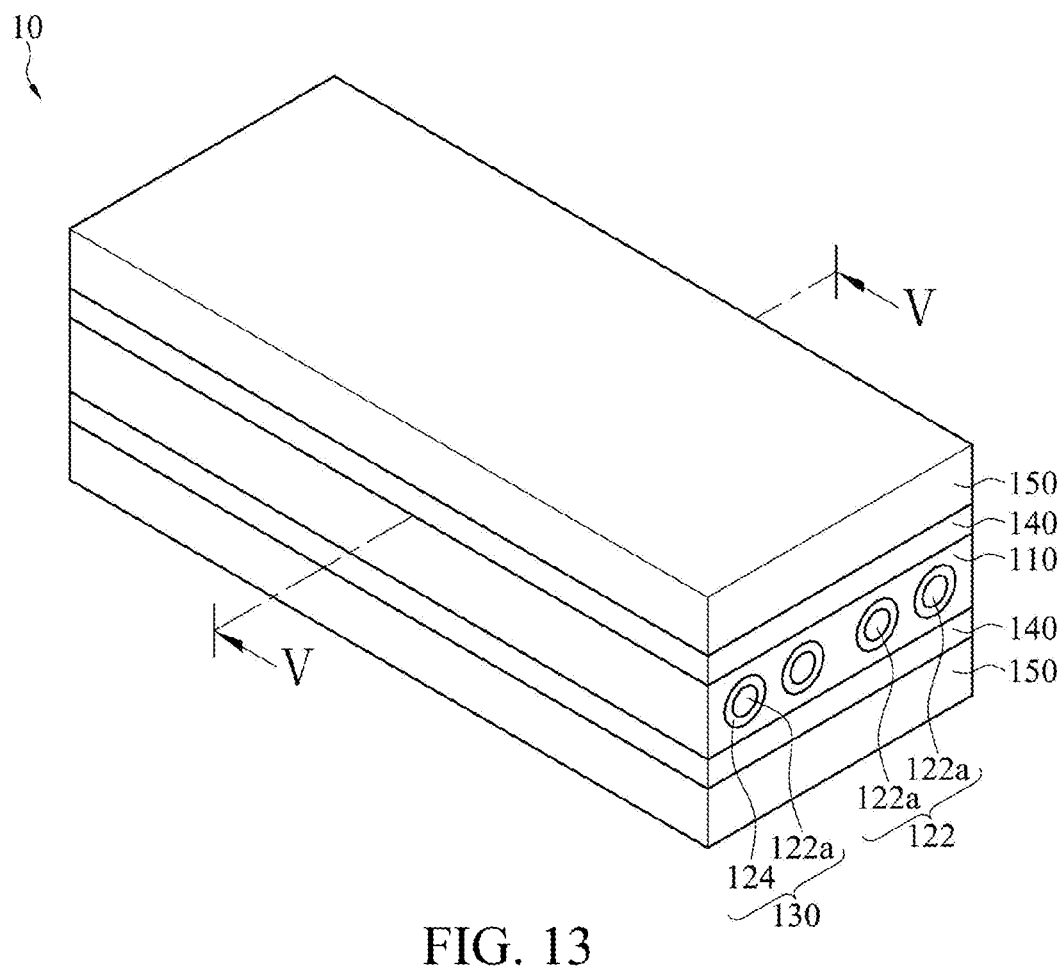
FIG. 13 is a schematic diagram of a fifth embodiment of a flexible flat cable.
Figure 14:
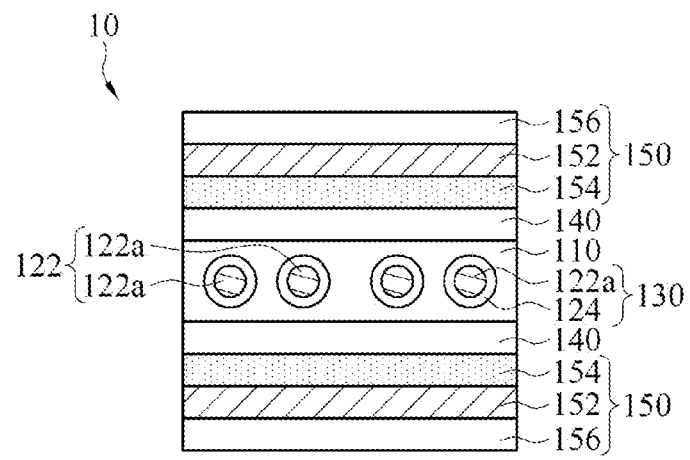
FIG. 14 is a schematic diagram of a cross section of an example along a cutting line V-V in FIG. 13.
Figure 15:
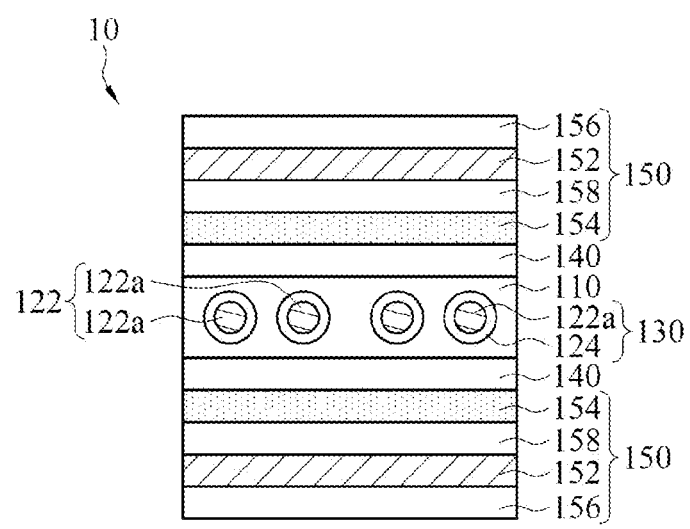
FIG. 15 is a schematic diagram of a cross section of another example along a cutting line V-V in FIG. 13.

In some embodiments, as shown in FIG. 13 to FIG. 15, the first conductors 122a are respectively covered by the low-k dielectric layers 124. In other words, a surface, surrounding the axis, of each first conductor 122a is covered by a low-k dielectric layer 124, to form conductors 130 with a jacket. In addition, the conductors 130 with a jacket are embedded in the first insulation layer 110. In an example, the conductors 130 with a jacket are arranged at intervals between each other. In other words, there is a gap between two adjacent conductors 130 with a jacket.

Figure 16:
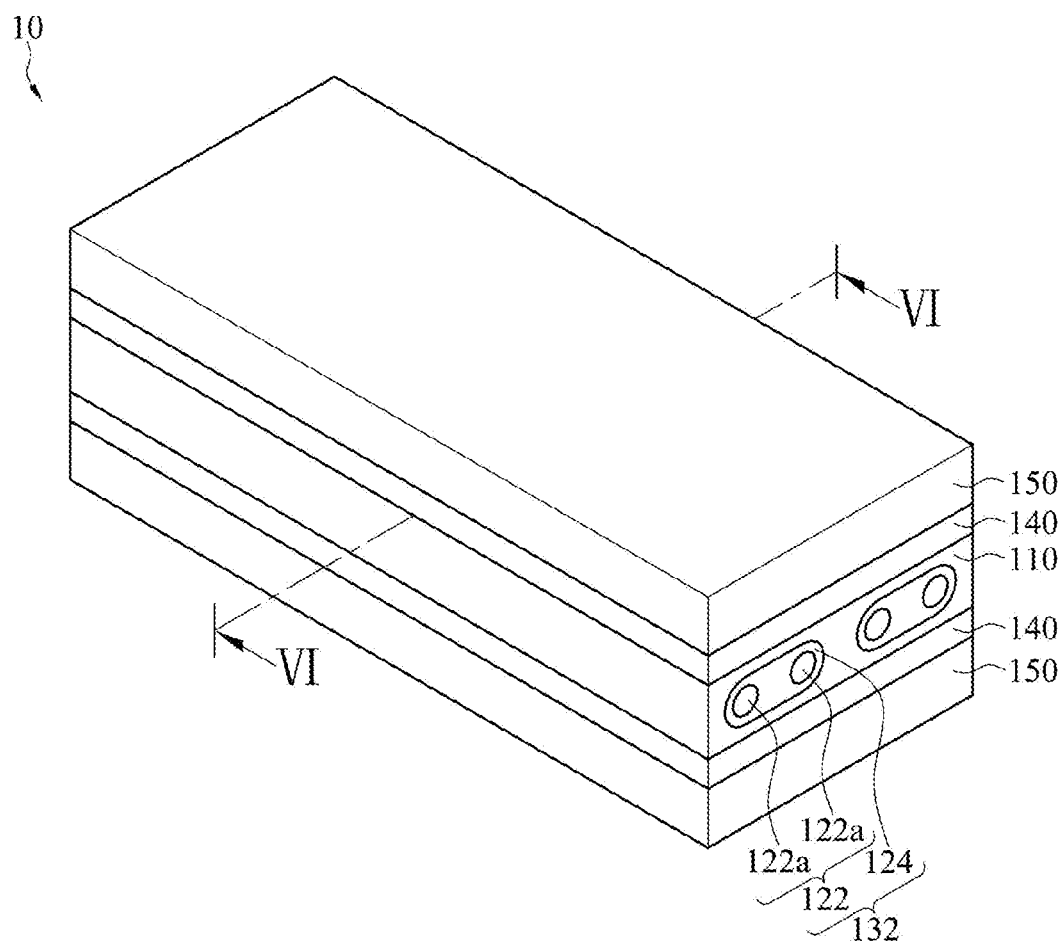
FIG. 16 is a schematic diagram of a sixth embodiment of a flexible flat cable.
Figure 17:
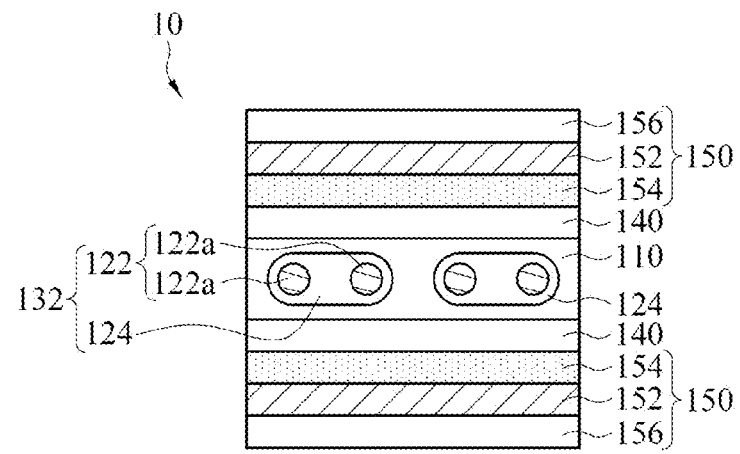
FIG. 17 is a schematic diagram of a cross section of an example along a cutting line VI-VI in FIG. 16.
Figure 18:
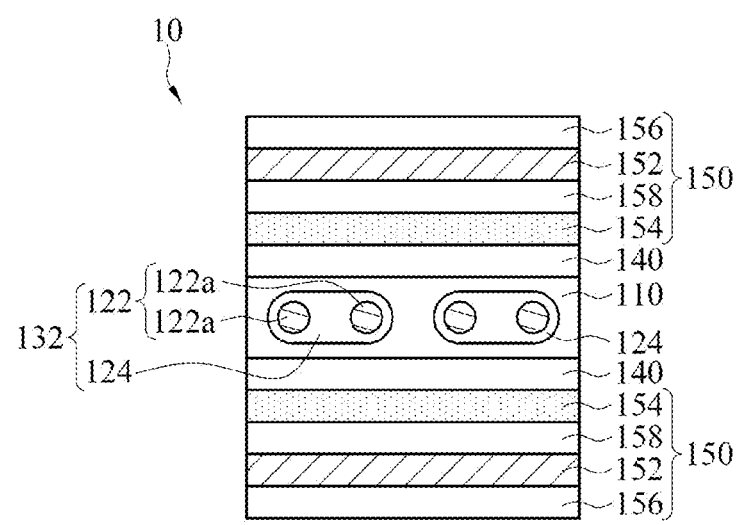
FIG. 18 is a schematic diagram of a cross section of another example along a cutting line VI-VI in FIG. 16.
Figure 19:
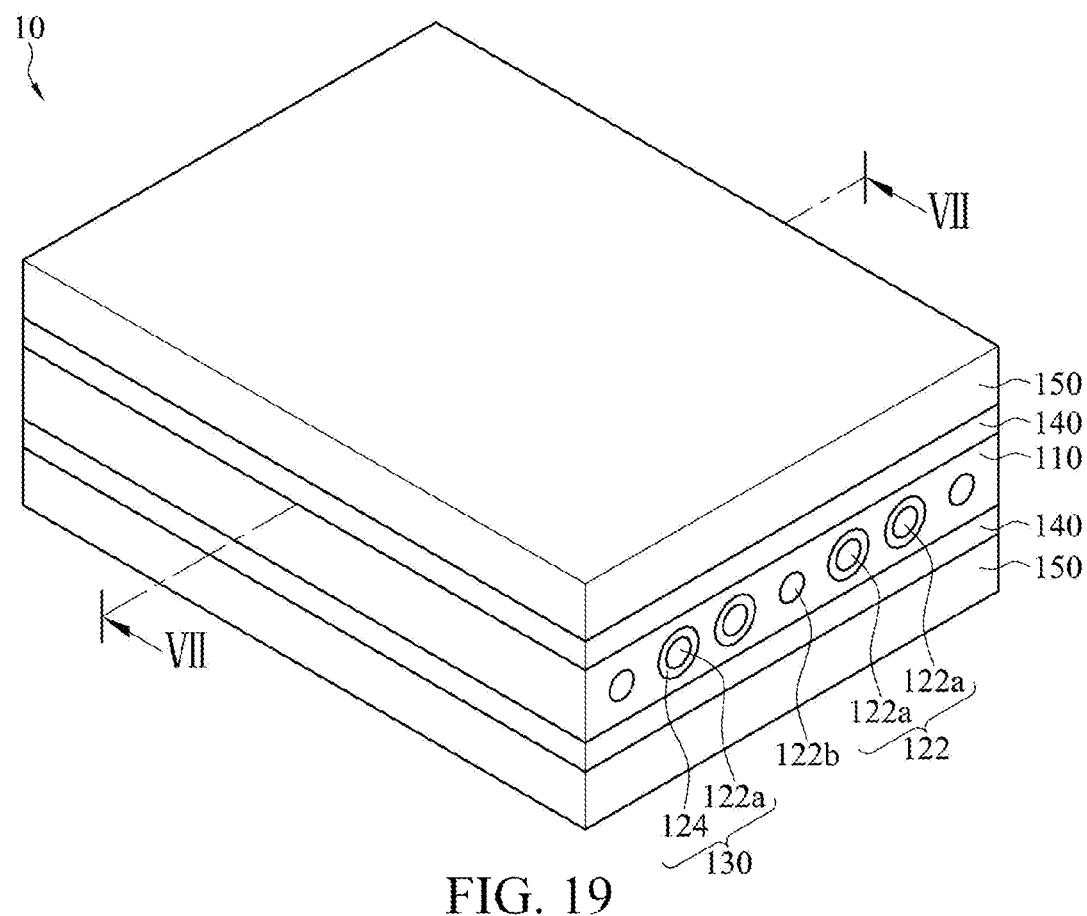
FIG. 19 is a schematic diagram of a seventh embodiment of a flexible flat cable.
Figure 20:
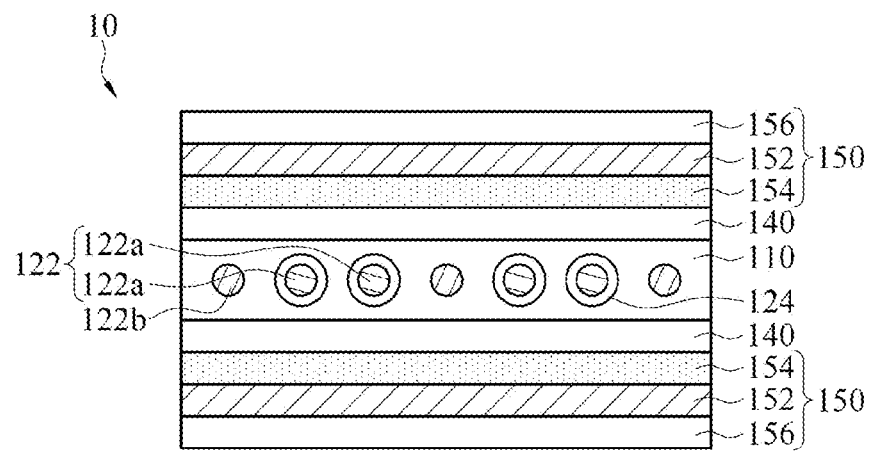
FIG. 20 is a schematic diagram of a cross section of an example along a cutting line VII-VII in FIG. 19.
Figure 21:
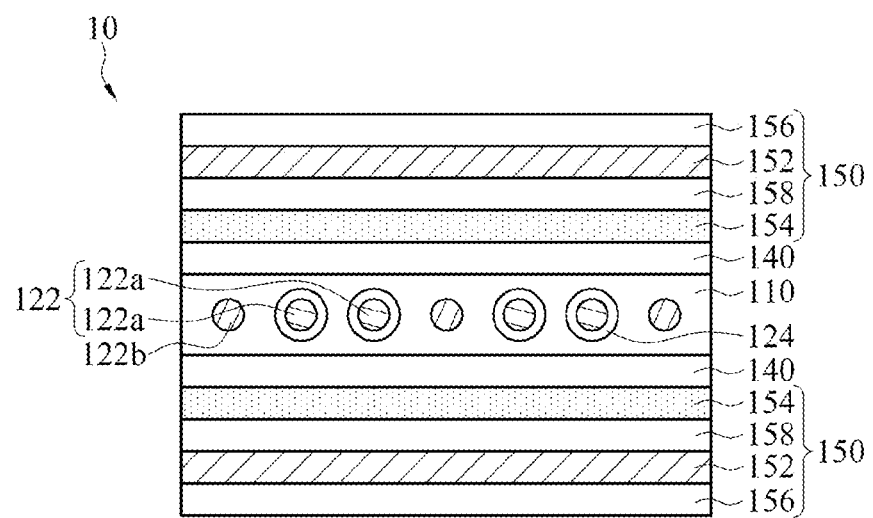
FIG. 21 is a schematic diagram of a cross section of another example along a cutting line VII-VII in FIG. 19.
Figure 22:
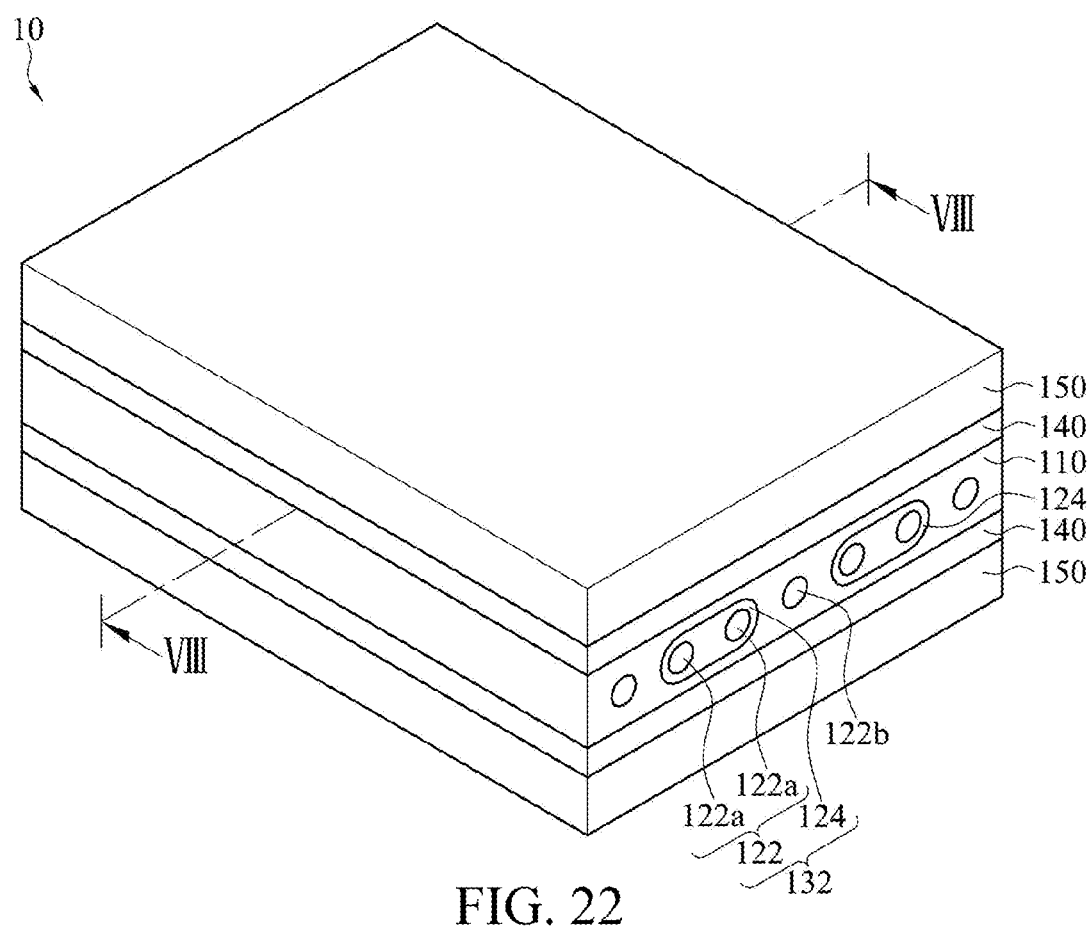
FIG. 22 is a schematic diagram of an eighth embodiment of a flexible flat cable.
Figure 23:
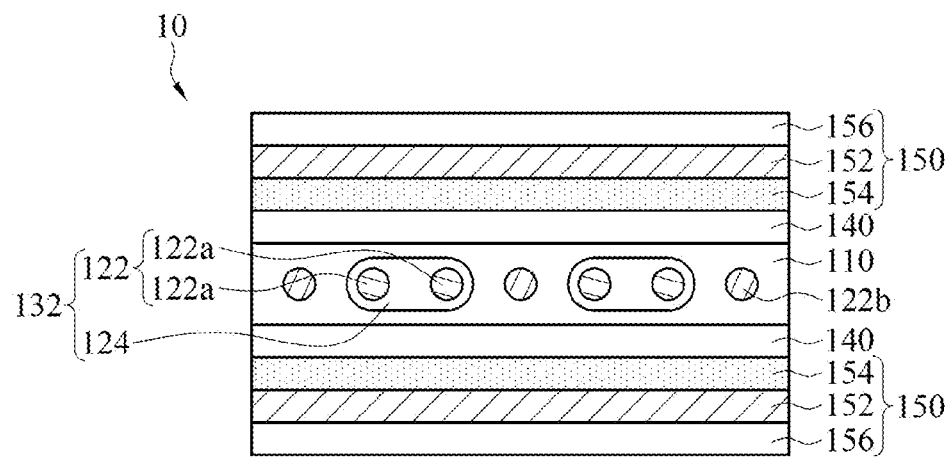
FIG. 23 is a schematic diagram of a cross section of an example along a cutting line VIII-VIII in FIG. 22.
Figure 24:
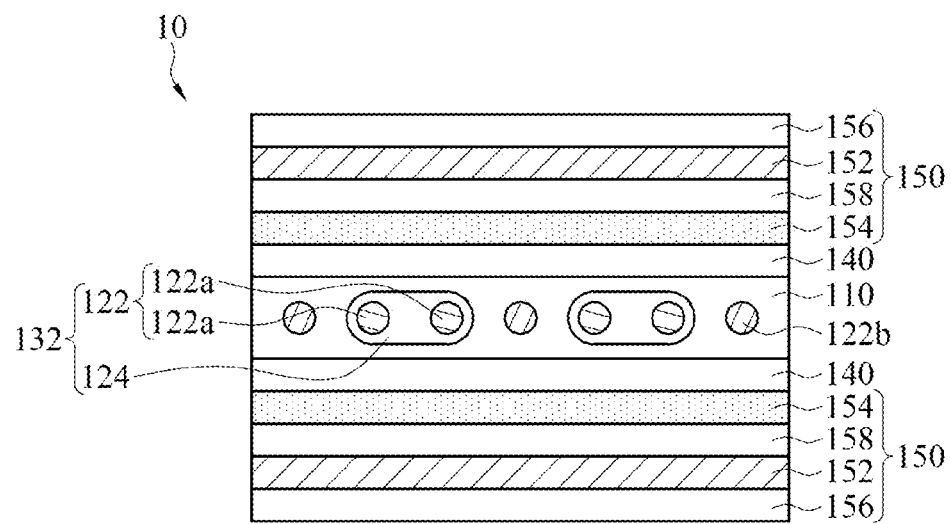
FIG. 24 is a schematic diagram of a cross section of another example along a cutting line VIII-VIII in FIG. 22.

In some other embodiment, as shown in FIG. 16 to FIG. 18, the pairs of conductors 122 are respectively covered by the low-k dielectric layers 124. In other words, each pair of conductors 122 is covered by a low-k dielectric layer 124, to form a pair of conductors 132 with a jacket. In addition, conductors 130 of the pairs of conductors 132 with a jacket are embedded in the first insulation layer 110. In an example, the low-k dielectric layers 124 extend longitudinally, are parallel to each other and are arranged at intervals. Each pair of conductors 122 is embedded in a corresponding low-k dielectric layer 124. In other words, there is a gap between two adjacent pairs of conductors 132 with a jacket.

The two second insulation layers 140 are respectively located on two surfaces of the first insulation layer 110. The shielding layer 150 is located on the second insulation layer 140 opposite to the first insulation layer 110.

In some embodiments, referring to FIG. 14 and FIG. 17, using two shielding layers 150 as an example, the two shielding layers 150 are respectively located on second insulation layers 140 opposite to a first insulation layer 110. Each shielding layer 150 includes a metal layer 152, an adhesive layer 154, and a third insulation layer 156. The metal layer 152 is located on a corresponding second insulation layer 140 opposite to the first insulation layer 110. The adhesive layer 154 is configured to bond the metal layer 152 and the second insulation layer 140 that are adjacent. The third insulation layer 156 is located on the corresponding metal layer 152 opposite to the second insulation layer 140, to protect the internal structure. For example, for one FFC 10, the second insulation layer 140, the adhesive layer 154, the metal layer 152, and the third insulation layer 156 are stacked sequentially outward from the middle first insulation layer 110.

In some embodiments, referring to FIG. 15 and FIG. 18, using two shielding layers 150 as an example, the two shielding layers 150 are respectively located on second insulation layers 140 opposite to a first insulation layer 110. Each shielding layer 150 includes an external dielectric layer 158, a metal layer 152, and an adhesive layer 154. The external dielectric layer 158 is located on a corresponding second insulation layer 140 opposite to the first insulation layer 110. The adhesive layer 154 is configured to bond the external dielectric layer 158 and the second insulation layer 140 that are adjacent. The metal layer 152 is located on the corresponding external dielectric layer 158 opposite to the second insulation layer 140. For example, for one FFC 10, the second insulation layer 140, the adhesive layer 154, the external dielectric layer 158, and the metal layer 152 are stacked sequentially outward from the middle first insulation layer 110. Here, the outermost side of the FFC 10 is not protected by a third insulation layer 156.

In some embodiments, each shielding layer 150 may further include a third insulation layer 156. In an example, the third insulation layer 156 is located on the corresponding metal layer 152 opposite to the adhesive layer 154, to provide protection. For example, for one FFC 10, the second insulation layer 140, the adhesive layer 154, the external dielectric layer 158, the metal layer 152, and the third insulation layer 156 are stacked sequentially outward from the middle first insulation layer 110. Here, the third insulation layer 156 is disposed on the outermost side of the FFC 10, to protect the internal structure. In another example, the third insulation layer 156 may be disposed between the metal layer 152 and the external dielectric layer 158 (not shown). In other words, the third insulation layer 156 is located on the corresponding external dielectric layer 158 opposite to the second insulation layer 140. The metal layer 152 is located on the corresponding third insulation layer 156 opposite to the adhesive layer 154. For example, for one FFC 10, the second insulation layer 140, the adhesive layer 154, the external dielectric layer 158, the third insulation layer 156, and the metal layer 152 are stacked sequentially outward from the middle first insulation layer 110. Here, the third insulation layer 156 is configured to adjust an absolute distance between the metal layer 152 and a conductor 122a, to provide a better signal shielding effect.

In some embodiments, as shown in FIG. 19 to FIG. 24, the FFC 10 may further include at least one conductor (a second conductor 122b) that is not covered or surrounded by a low-k dielectric layer 124, that is, a conductor with no jacket. The second conductor 122b axially extends and is arranged in parallel with the pairs of conductors 122. The second conductor 122b is directly embedded in the first insulation layer 110. The pairs of conductors 122 and the second conductors 122b are arranged at intervals and in a way that their lateral positions are switched one for the other. In some embodiments, viewed from a cross section of the FFC 10, two conductors that are closest to two side edges of the FFC 10 are the second conductors 122b, that is, conductors with no jacket.

In some embodiments, the metal layer 152 may be a metal foil or a metal coating. In some embodiments, the metal layer 152 may be formed on a surface of the third insulation layer 156 by means of dry lamination, wet lamination, or evaporation.

In some embodiments, the external dielectric layer 158 may be formed on a surface, adjacent to the first insulation layer 110, of the metal layer 152 or the third insulation layer 156 by means of dry lamination, wet lamination, or coating.

In some embodiments, the adhesive layer 154 is formed on a surface of the external dielectric layer 158 or the metal layer 152 by means of trans-lamination, wet lamination or coating. In some embodiments, the adhesive layer 154 may be a dielectric adhesive layer.

In some embodiments, the first insulation layer 110 is hot melt. In some embodiments, the first insulation layer 110 may be formed on a surface of the second insulation layer 140 by means of wet lamination or coating.

Figure 25:
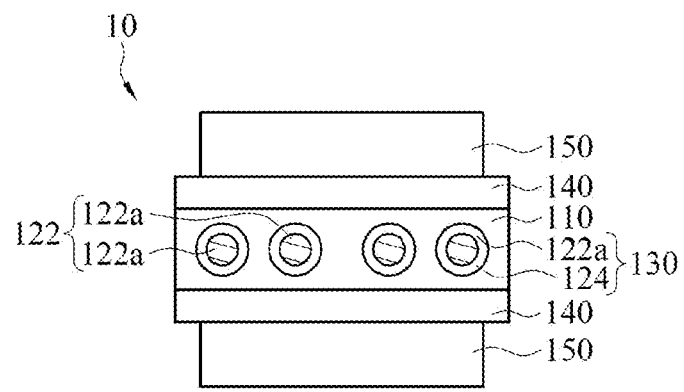
FIG. 25 and FIG. 26 are schematic diagrams of a cross section of a flexible flat cable with a first exemplary shielding layer.
Figure 26:
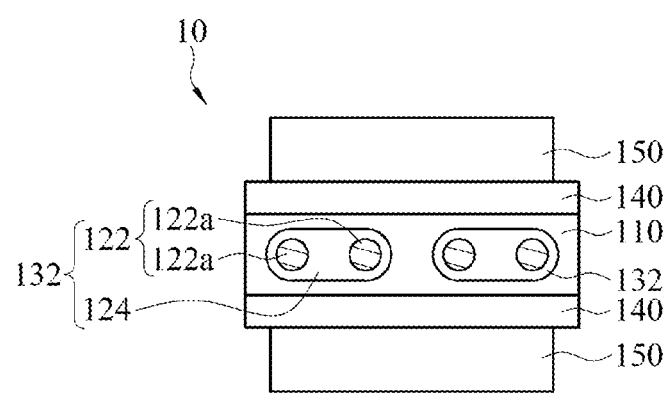

In some embodiments, as shown in FIG. 13 to FIG. 24, if there are two shielding layers 150, a width of the shielding layer 150 may be approximately equal to a width of the second insulation layer 140. That is, edges of the shielding layer 150, the second insulation layer 140, and the first insulation layer 110 are flush with each other. In some embodiments, as shown in FIG. 25 and FIG. 26, if there are two shielding layers 150, a width of the second insulation layer 140 may exceed a width of the shielding layer 150. That is, viewed from a cross section of the FFC 10, two side edges of the second insulation layer 140 (and the first insulation layer 110) respectively exceed two side edges of each shielding layer 150, to make each shielding layer 150 shrink inward opposite to the second insulation layer 140.

Figure 27:
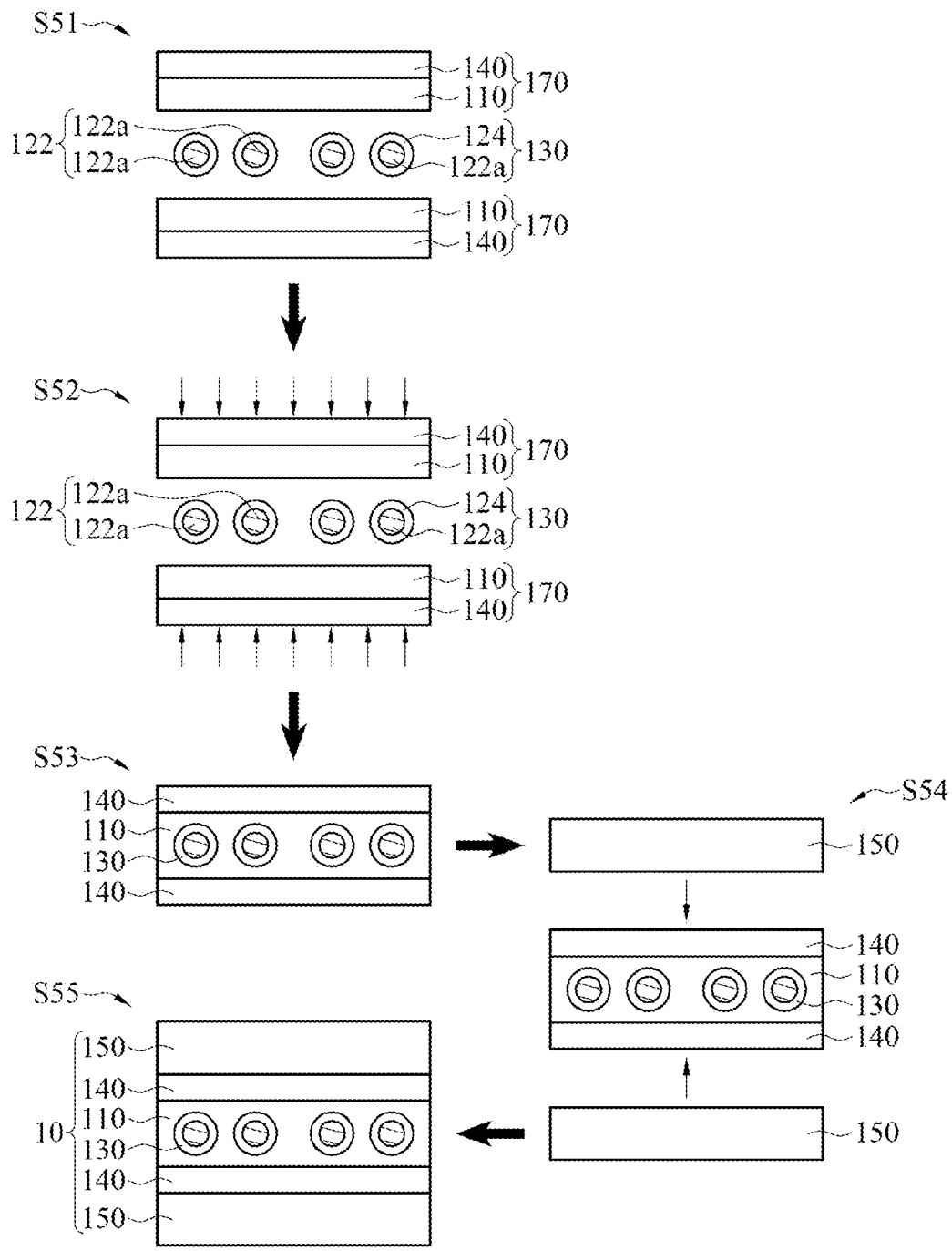
FIG. 27 is a flowchart of a fifth embodiment of a manufacturing method for a flexible flat cable.
Figure 28:
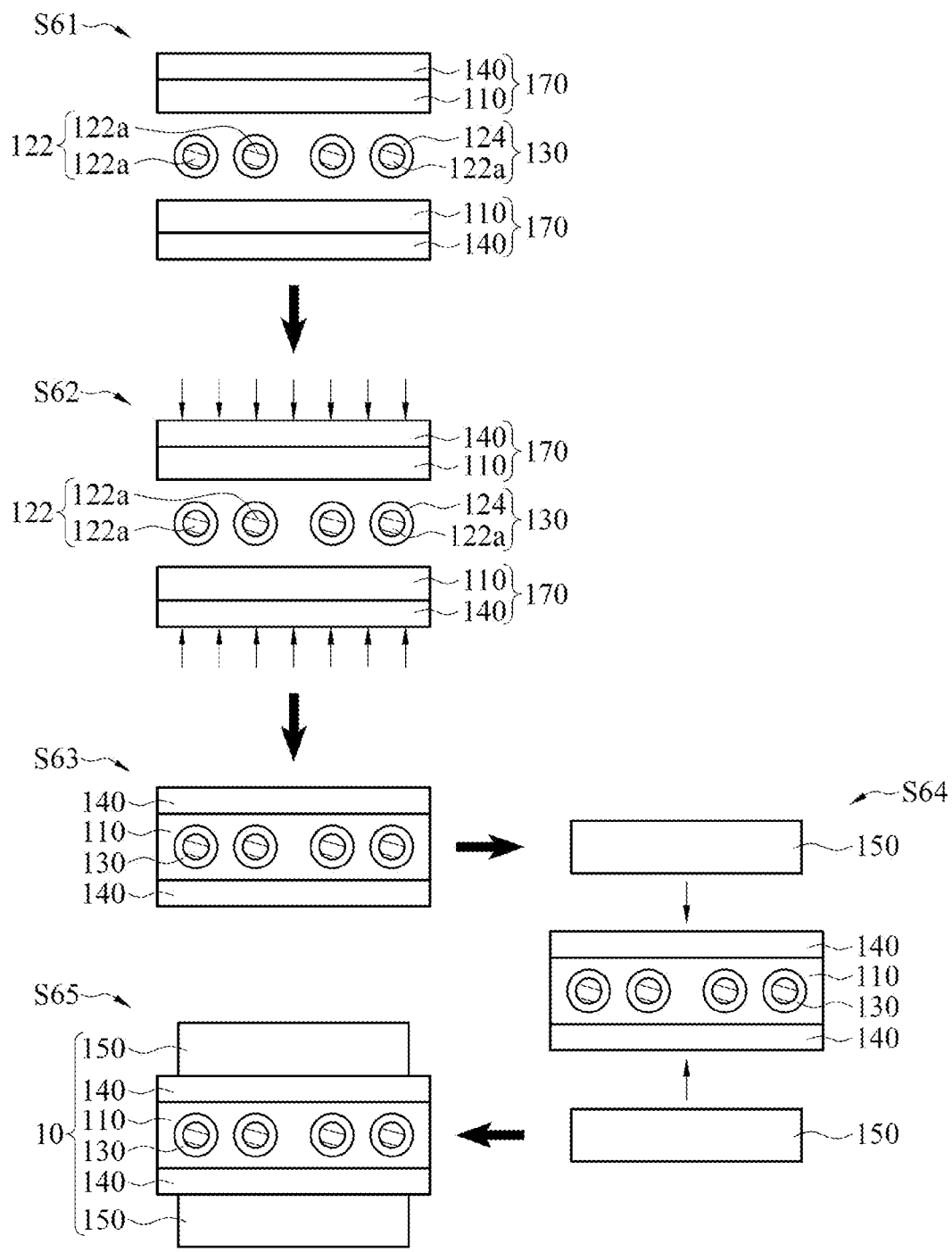
FIG. 28 is a flowchart of a sixth embodiment of a manufacturing method for a flexible flat cable.

In some embodiments, as shown in FIG. 27 and FIG. 28, if edges of the FFC 10 are flush with each other or the shielding layer 150 of the FFC 10 shrinks inward, the FFC 10 may be manufactured by using the following method. Referring to FIG. 27 and FIG. 28, first, at least one pair of conductors 122 (that is, a plurality of conductors 130 with a jacket or at least one pair of conductors (132, not shown) with a jacket) is arranged in parallel between two insulation films 170 (step S51 or S61). Each insulation film 170 includes a first insulation layer 110 and a second insulation layer 140. The first insulation layer 110 is adjacent to the pair of conductors 122 and is stacked on the second insulation layer 140, that is, the first insulation layer 110 covers an internal surface of the second insulation layer 140. The first insulation layer 110 herein is hot melt.

After step S51 or S61, the two insulation films 170 are laminated into one insulation layer (step S52 or S62), and the conductors 130 with a jacket or the pairs of conductors 132 with a jacket are embedded in the insulation layer (step S53 or S63). Therefore, in the lamination step, the first insulation layers 110 on internal sides of the two insulation films 170 may be fused into one layer due to lamination, and the conductor 130 with a jacket or the pair of conductors 132 with a jacket (and the conductor 122*b* with no jacket, not shown) is embedded in the layer.

After step S53 or S63, two shielding films (that is, the shielding layers 150) are then respectively laminated on two external surfaces of the two insulation films 170 opposite to the pairs of conductors 122 (step S54 or S64), to form the FFC 10 (step S55 or S65). In other words, the two shielding films (that is, the shielding layers 150) are respectively laminated on the two second insulation layers 140 opposite to the first insulation layer 110. In an example, as shown in FIG. 27, each shielding film (that is, the shielding layer 150) is flush with the insulation film 170 (that is, the first insulation layer 110 and the second insulation layer 140). In another example, viewed from a cross section of the FFC 10, two side edges of the insulation film 170 (that is, the first insulation layer 110 and the second insulation layer 140) and two side edges of each shielding film (that is, the shielding layer 150) shrink inward. That is, as shown in FIG. 28, a width of each shielding film (that is, the shielding layer 150) is less than a width of the insulation film 170 (that is, the first insulation layer 110 and the second insulation layer 140). The stacked structure of each shielding film (that is, the shielding layer 150) is the same as that described in the foregoing embodiments, and therefore is not repeated.

Figure 29:
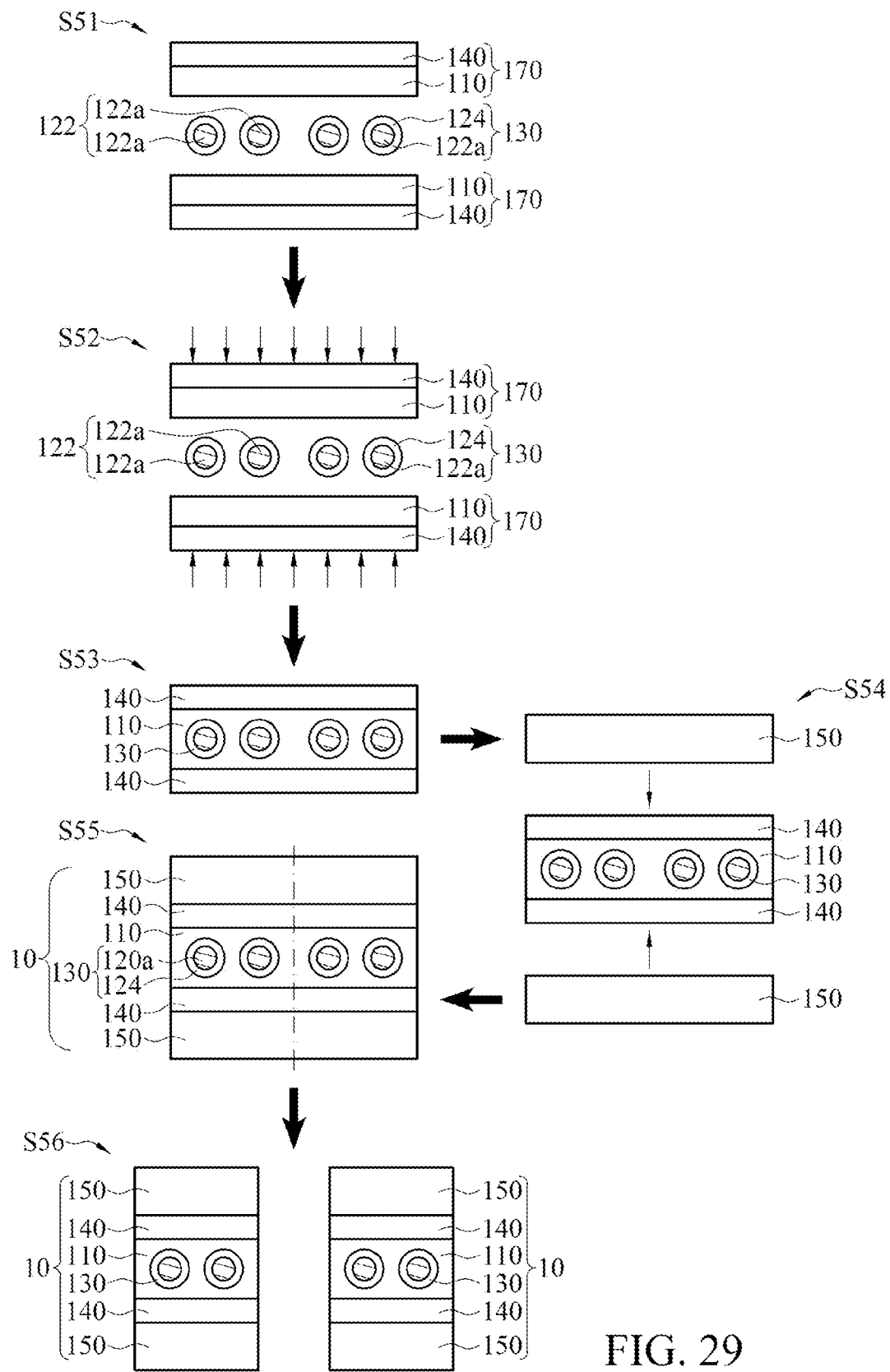
FIG. 29 is a flowchart of a seventh embodiment of a manufacturing method for a flexible flat cable.

In some embodiments, as shown in FIG. 29, a large block of FFC 10 including a large quantity of pairs of conductors 122, that is, a plurality of FFCs 10 coupled to each other at edges (that is, side edges extending along the conductors 122*a*) may be formed at a time based on steps S51 to S55, and then cutting (that is, cutting off two adjacent conductors 122*a*) is performed according to the quantity of conductors 122*a* required by each FFC 10 to split the large block of FFC into a plurality of FFCs 10 (step S56).

Figure 30:
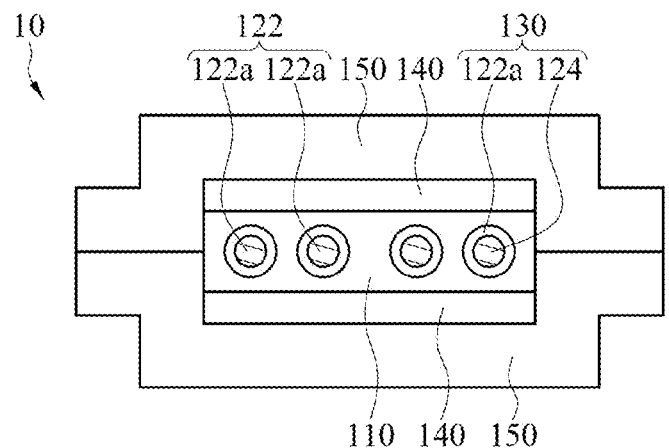
FIG. 30 and FIG. 31 are schematic diagrams of a cross section of a flexible flat cable with a second exemplary shielding layer.
Figure 31:
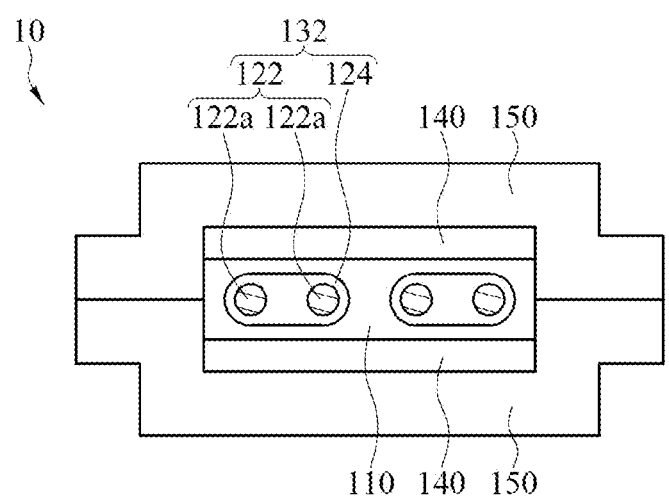

In some embodiments, as shown in FIG. 30 and FIG. 31, if there are two shielding layers 150, a width of the shielding layer 150 may exceed a width of the second insulation layer 140. That is, viewed from a cross section of the FFC 10, two side edges of each shielding layer 150 respectively exceed two side edges of the second insulation layer 140 (and the first insulation layer 110), to make each shielding layer 150 protrude outward opposite to the second insulation layer 140.

Figure 32:
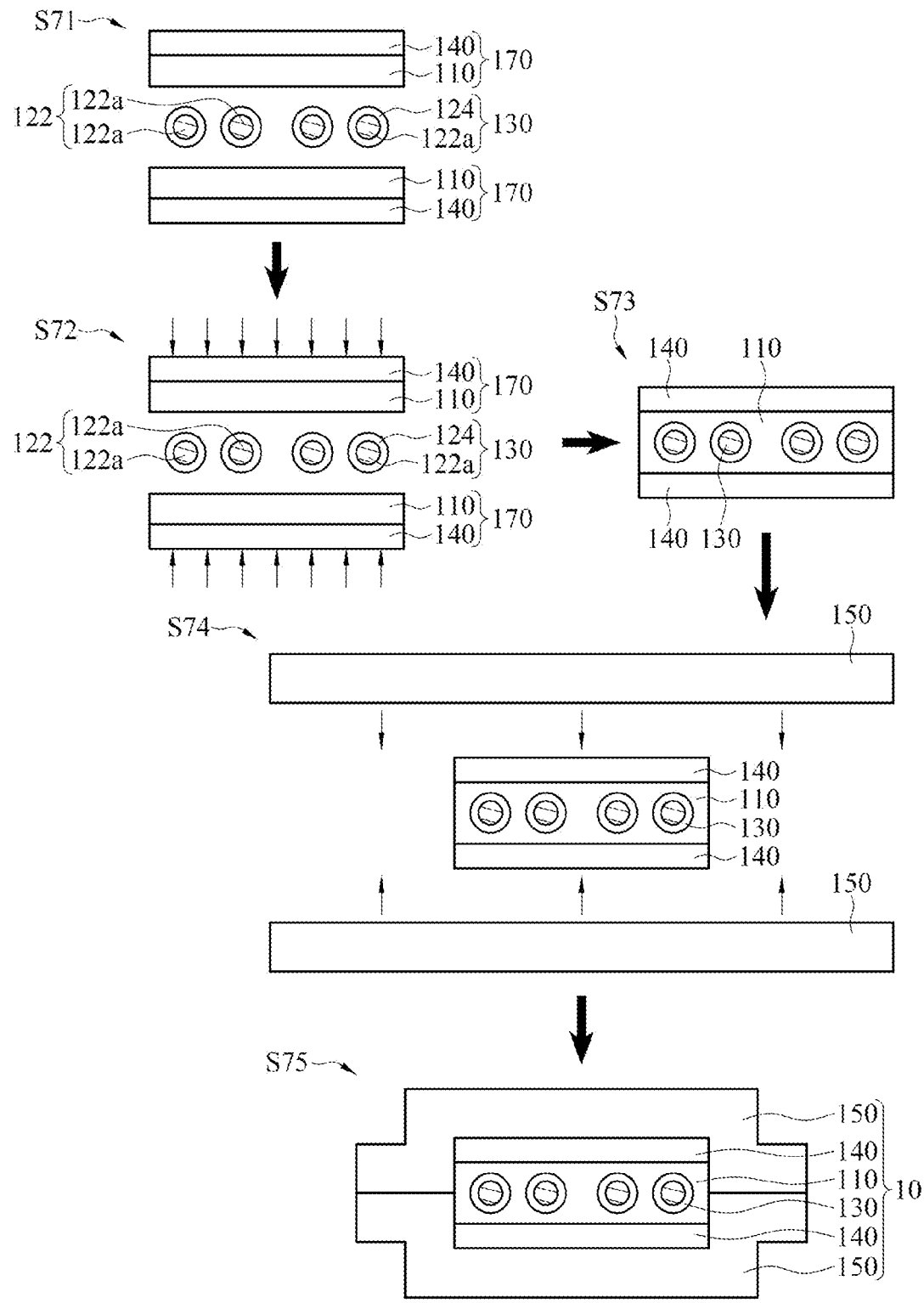
FIG. 32 is a flowchart of an eighth embodiment of a manufacturing method for a flexible flat cable.

In some embodiments, as shown in FIG. 32, if the shielding layer 150 of the FFC 10 protrudes outward, the FFC 10 may be manufactured by using the following method. Referring to FIG. 32, first, at least one pair of conductors 122 (that is, a plurality of conductors 130 with a jacket or at least one pair of conductors (132, not shown) with a jacket) is arranged in parallel between two insulation films 170 (step S71). Each insulation film 170 includes a first insulation layer 110 and a second insulation layer 140. The first insulation layer 110 is adjacent to the pair of conductors 122 and is stacked on the second insulation layer 140, that is, the first insulation layer 110 covers an internal surface of the second insulation layer 140. The first insulation layer 110 herein is hot melt.

After step S71, the two insulation films 170 are laminated into one insulation layer (step S72), and the conductors 130 with a jacket or the pairs of conductors 132 with a jacket are embedded in the insulation layer (step S73). Therefore, in the lamination step, the first insulation layers 110 on internal sides of the two insulation films 170 may be fused into one layer due to lamination, and the conductor 130 with a jacket or the pair of conductors (132) with a jacket (and the conductor 122*b* with no jacket, not shown) is embedded in the layer.

After step S73, two shielding films (that is, the shielding layers 150) are then respectively laminated on two external surfaces of the two insulation films 170 opposite to the pairs of conductors 122, and segments, exceeding the insulation film 170 (that is, the insulation layer), of the two shielding films (that is, the shielding layers 150) are laminated with each other (step S74), to form the FFC 10 (step S75). In other words, the two shielding films (that is, the shielding layers 150) are respectively laminated on the two second insulation layers 140 opposite to the first insulation layer 110. Segments, exceeding the insulation film 170 (that is, the insulation layer), at one end of the two shielding films (that is, the shielding layers 150) are laminated with each other, and segments, exceeding the insulation film 170 (that is, the insulation layer), at the other end of the two shielding films (that is, the shielding layers 150) are laminated with each other. Therefore, the stacked structure of each shielding film (that is, the shielding layer 150) is the same as that described in the foregoing embodiments, and therefore is not repeated.

Figure 33:
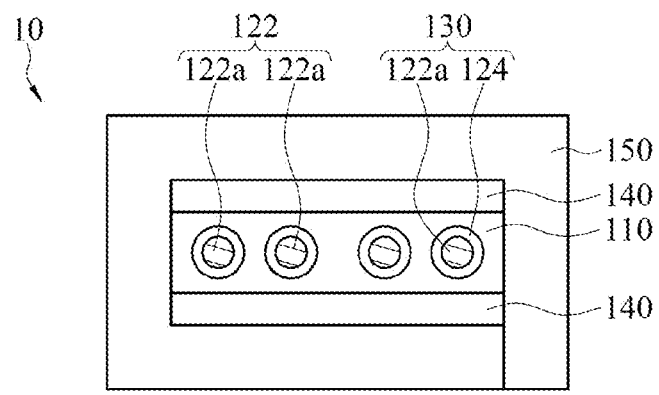
FIG. 33 and FIG. 34 are schematic diagrams of a cross section of a flexible flat cable with a third exemplary shielding layer.
Figure 34:
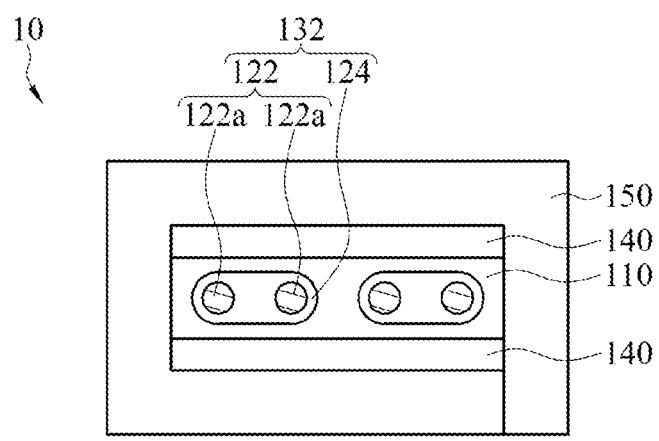
Figure 35:
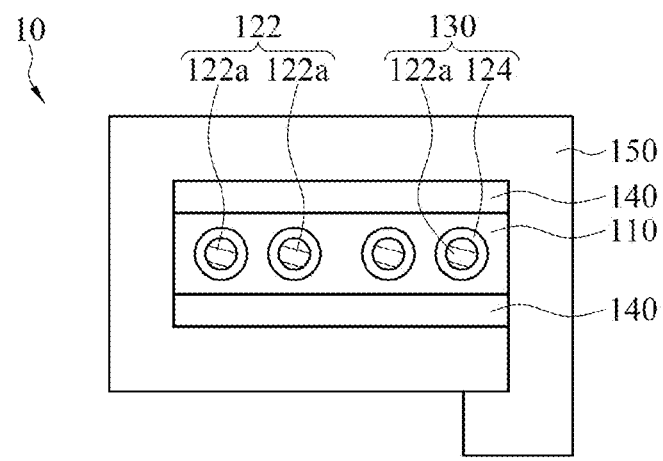
FIG. 35 and FIG. 36 are schematic diagrams of a cross section of a flexible flat cable with a fourth exemplary shielding layer.
Figure 36:
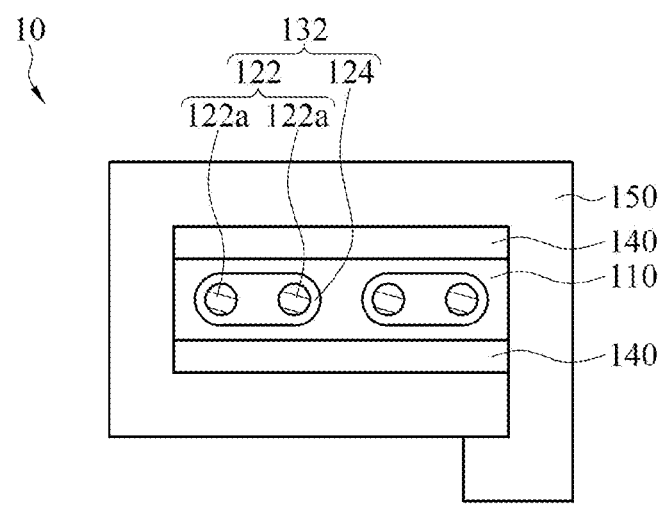

In some embodiments, if there is only one shielding layer 150, the two second insulation layers 140 may be surrounded and covered by the shielding layer 150. That is, as shown in FIG. 33 and FIG. 34, the shielding layer 150 is envelope-shaped. In other words, the shielding layer 150 surrounds and covers a multi-layered structure in which the second insulation layer 140, the first insulation layer 110, and the second insulation layer 140 are sequentially stacked. In an example, as shown in FIG. 33 and FIG. 34, after the shielding layer 150 surrounds the foregoing multi-layered structure, two ends of the shielding layer 150 are bonded with each other. In another example, as shown in FIG. 35 and FIG. 36, after the shielding layer 150 surrounds the foregoing multi-layered structure, two ends of the shielding layer 150 may be stacked and laminated with each other.

Figure 37:
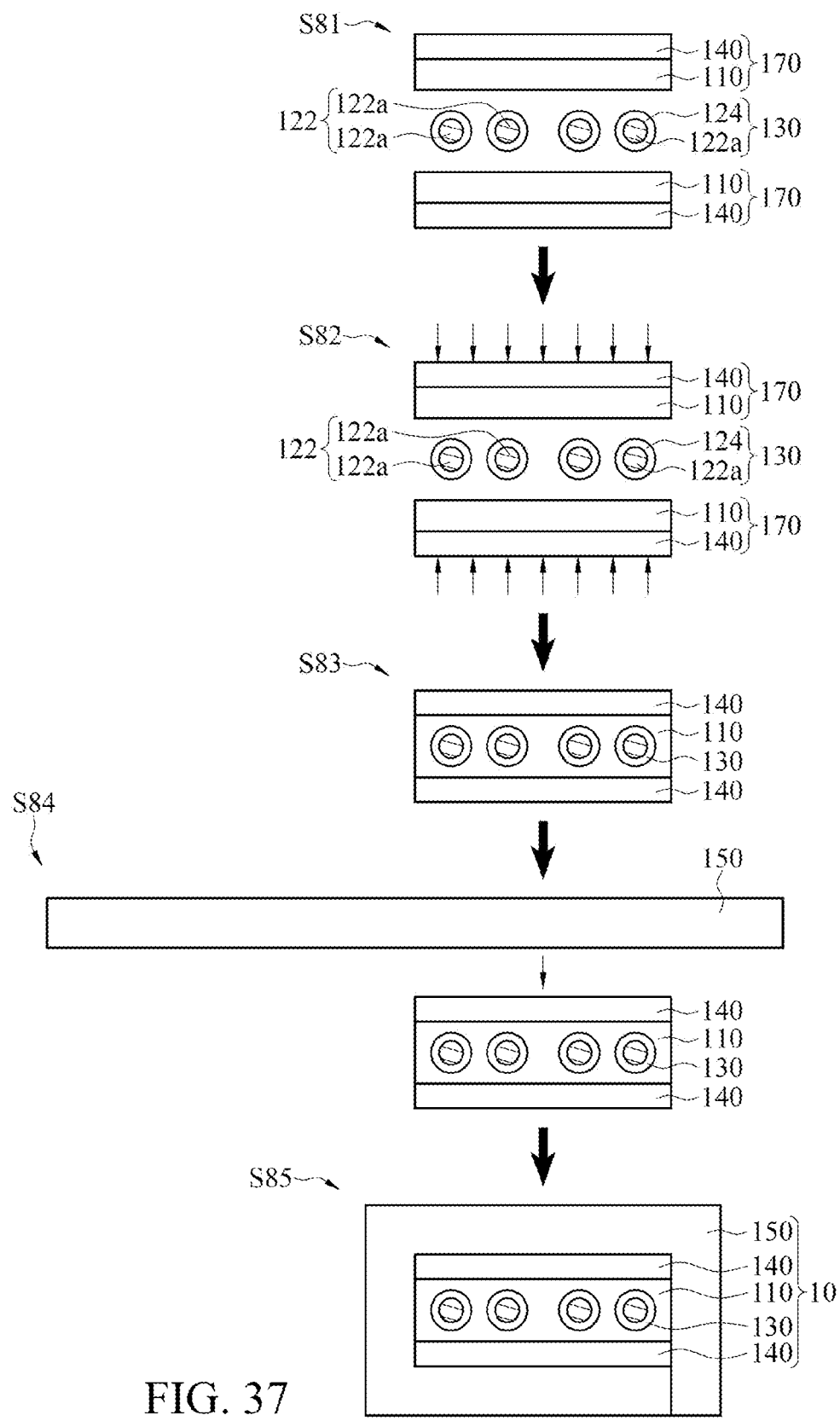
FIG. 37 is a flowchart of a ninth embodiment of a manufacturing method for a flexible flat cable.

In some embodiments, as shown in FIG. 37, if the shielding layer 150 of the FFC 10 is envelope-shaped, the FFC 10 may be manufactured by using the following method. Referring to FIG. 37, first, at least one pair of conductors 122 (that is, a plurality of conductors 130 with a jacket or at least one pair of conductors (132, not shown)

with a jacket) is arranged in parallel between two insulation films 170 (step S81). Each insulation film 170 includes a first insulation layer 110 and a second insulation layer 140. The first insulation layer 110 is adjacent to the pair of conductors 122 and is stacked on the second insulation layer 140, that is, the first insulation layer 110 covers an internal surface of the second insulation layer 140. The first insulation layer 110 herein is hot melt.

After step S81, the two insulation films 170 are laminated into one insulation layer (step S82), and the conductors 130 with a jacket or the pairs of conductors 132 with a jacket are embedded in the insulation layer (step S83). Therefore, in the lamination step, the first insulation layers 110 on internal sides of the two insulation films 170 may be fused into one layer due to lamination, and the conductor 130 with a jacket or the pair of conductors 132 with a jacket (and the conductor 122b with no jacket, not shown) is embedded in the layer.

After step S83, one shielding film (that is, the shielding layer 150) surrounds the insulation layer (that is, the multi-layered structure in which the second insulation layer 140, the first insulation layer 110, and the second insulation layer 140 are sequentially stacked) in a circle and is laminated on the insulation layer (step S84), to form the FFC (step S85). Therefore, the stacked structure of the shielding film (that is, the shielding layer 150) is the same as that described in the foregoing embodiments, and therefore is not repeated.

In some embodiments, before step S51, S61, S71, or S81, the insulation films 170 may be formed in advance. In some embodiments, a step of forming the insulation films 170 may include: forming the first insulation layer 110 on a surface of the second insulation layer 140 by means of wet lamination or coating. The first insulation layer 110 is made of a hot melt material.

In some embodiments, for example, the foregoing wet lamination may be extrusion.

In some embodiments, the material of the foregoing conductors 122a and 122b may be aluminum (Al), copper (Cu), gold (Au), argent (Ag), or multi-layered metals. In some embodiments, the multi-layered metal conductors 122a and 122b may be, for example, conductors 122a and 122b made of copper but having an outer layer plated with at least one of the following metals: tin, nickel, alloy, argent, gold, aluminum, and the like.

In some embodiments, the conductors 112a and 112b may be solid conductors (for example, signal-core cables) or stranded conductors (for example, multi-core cables). In some embodiments, a shape of a cross section of the conductors 112a and 112b may be circular, oblate, oval, rectangular, or beveled rectangular. The cross section of the conductors 112a and 112b is approximately perpendicular to the axis of the conductors 112a and 112b. In some embodiments, an aspect ratio of the cross section of the rectangular or beveled rectangular conductors 112a and 112b may be 6:1.

For example, the conductors 112a and 112b may be but is not limited to circular solid conductors, circular stranded conductors, oblate solid conductors, oblate stranded conductors, oval solid conductors, oval stranded conductors, rectangular solid conductors, rectangular stranded conductors, beveled rectangular solid conductors, or beveled rectangular stranded conductors.

In some embodiments, the material of the low-k dielectric layer 124, the material of the first insulation layer 110, the material of the second insulation layer 140, the material of the adhesive layer 154, the material of the external dielectric layer 158, and the material of the third insulation layer 156 may be high polymers.

In some embodiments, the material of the low-k dielectric layer 124 may be a temperature-resistant material. Therefore, the melting point of the low-k dielectric layer 124 is higher than the melting point of the first insulation layer 110.

In some embodiments, the dielectric constant of the low-k dielectric layer 124 is lower than that of the outermost insulation layer (that is, the second insulation layer 140 shown in FIG. 1 to FIG. 8 or the third insulation layer 156 shown in FIG. 13 to FIG. 24). In some embodiments, the dielectric constant of the low-k dielectric layer 124 is lower than 2.5. The material of the low-k dielectric layer 124 may be fluorinated ethylene propylene (FEP), polypropylene (PP), polylefin (PO), polyethene (PE), liquid crystal polymer (LCP), or the like.

In some embodiments, microbubbles may be formed in the low-k dielectric layer 124 through a foaming technology. In some embodiments, a medium in the microbubbles in the low-k dielectric layer 124 may be air.

In some embodiments, a shortest distance between the edge of the conductor 122a and the external edge of the low-k dielectric layer 124 is less than or equal to a radius of the conductor 122a.

In some embodiments, the material of the foregoing first insulation layer 110 may be PO, thermoplastic elastomer (TPE), thermoplastic polyurethane (TPU), or the like. Preferably, the material of the first insulation layer 110 may be a low-k material. The dielectric constant of the first insulation layer 110 may be less than 2.5.

In some embodiments, the material of the second insulation layer 140 shown in FIG. 13 to FIG. 24 may be polyethylene terephthalate (PET), FEP, polyphenylene sulfide (PPS), LCP, or the like. Preferably, the material of the second insulation layer 140 shown in FIG. 13 to FIG. 24 may be a low-k material. The dielectric constant of the second insulation layer 140 shown in FIG. 13 to FIG. 24 may be less than 2.5.

In some embodiments, a main component of the material of the adhesive layer 154 may be PET, acrylic, silicone, PP, PO, TPE, TPU, or the like. Preferably, the main component of the material of the adhesive layer 154 may be a low-k material, such as PP, PO, TPE, or TPU. The dielectric constant of the adhesive layer 154 may be less than 2.5.

In some embodiments, the material of the external dielectric layer 158 may be PET, acrylic, silicone, PP, PO, TPE, TPU or the like. Preferably, the material of the external dielectric layer 158 may be a low-k material, such as PP, PO, TPE, or TPU. The dielectric constant of the external dielectric layer 158 may be less than 2.5.

In some embodiments, the conductors 130 with a jacket or the pairs of conductors 132 with a jacket may be applied to high-speed signal transmission. In other words, the conductors 130 with a jacket or the pairs of conductors 132 with a jacket may be configured to transmit signals at a high speed. In some embodiments, a rate used for transmitting signals by the conductors 130 with a jacket or the pairs of conductors 132 with a jacket may be equal to or greater than 10 Gbps.

In addition, the conductors 122b with no jacket are applied to non-high-speed signal transmission. For example, the conductors 122b with no jacket may be configured to transmit power or connect to ground.

In some embodiments, the FFC 10 may include only the conductors 130 with a jacket or only the pairs of conductors 132 with a jacket, and does not include the conductors 122b with no jacket. Therefore, the conductors 112a in the FFC 10 may be arranged at equal intervals.

In some embodiments, the FFC 10 may include the conductors 130 with a jacket or the pairs of conductors 132 with a jacket, and include the conductors 122b with no jacket. Therefore, the conductors 112a and 112b in the FFC 10 may be arranged at equal intervals.

Figure 38:
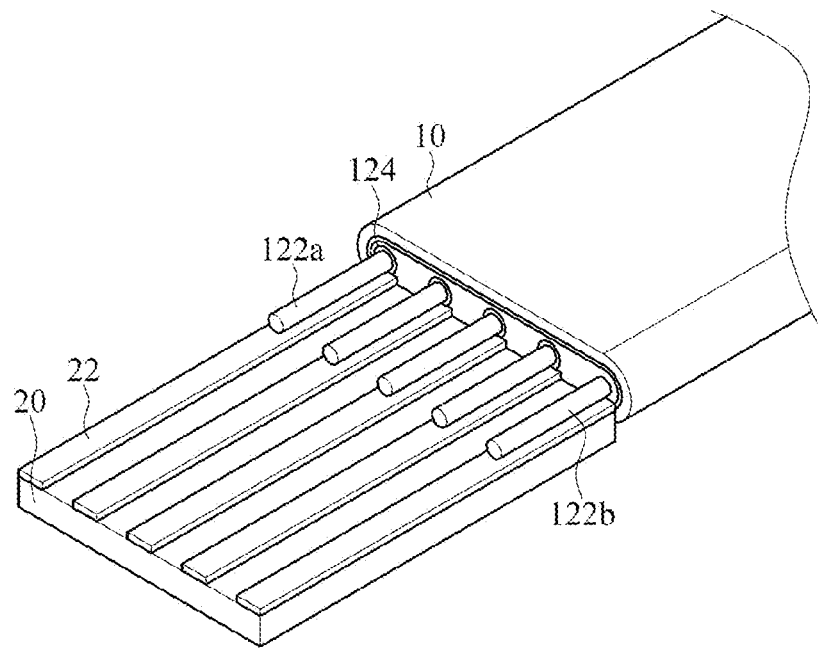
FIG. 38 is a schematic diagram of a first application example of a flexible flat cable.

In some embodiments, referring to FIG. 38, the conductors 112a and 112b of the FFC 10 according to any one of the foregoing embodiments may be directly soldered on a circuit board 20, to electrically connect the conductors 112a and 112b to a circuit 22 on the circuit board 20.

Figure 39:
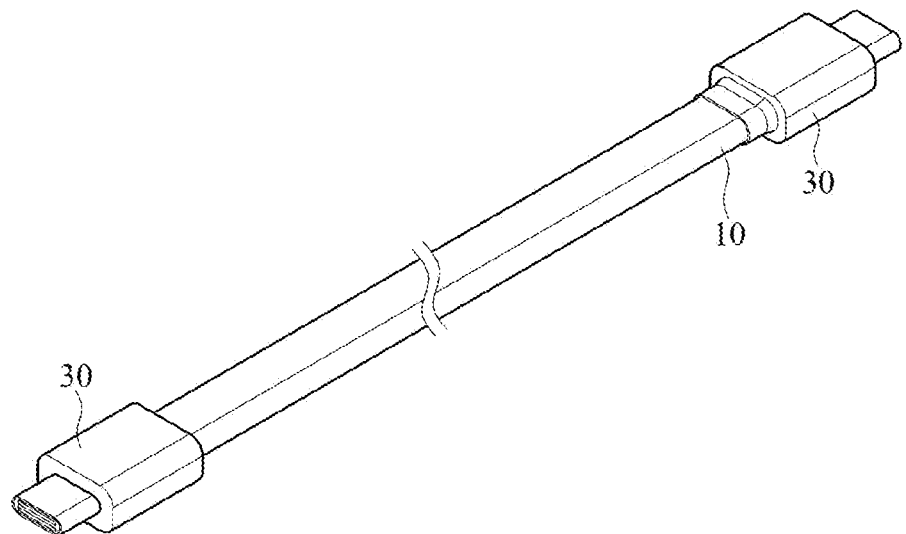
FIG. 39 is a schematic diagram of a second application example of a flexible flat cable.

In some embodiments, referring to FIG. 39, one end or two ends of the FFC 10 according to any one of the foregoing embodiments may be coupled to an electrical connector component 30, to form a signal transmission wire (that is, a signal transmission device). Therefore, the conductors 112a and 112b of the FFC 10 are electrically connected to a conductive terminal of the electrical connector component 30.

Based on above, according to the FFC, the manufacturing method thereof, and the signal transmission device of the present invention, the conductor 112a clamped in an insulation layer (that is, the first insulation layer 110) is covered by a layer of low-k material (that is, the low-k dielectric layer 124), to prevent a high-k material from affecting the signal transmission, to further improve quality of high-speed signal transmission relatively. In addition, according to the embodiments of the present invention, the process is convenient and low in cost.

What is claimed is:

1. A flexible flat cable (FFC), comprising:
a first insulation layer, being hot melt;
at least one pair of conductors, within the first insulation layer, wherein each of the at least one pair of conductors comprises a plurality of first conductors, and the plurality of first conductors are axially extending and arranged in parallel;
at least one low-k dielectric layer, embedded within the first insulation layer, respectively corresponding to the at least one pair of conductors, wherein the plurality of first conductors in a same pair of the at least one pair of conductors are collectively and directly covered and surrounded with corresponding one of the at least one low-k dielectric layer, and wherein the first insulation layer is formed by fusing two first insulation layers;
two second insulation layers, on two surfaces of the first insulation layer; and
at least one shielding layer, on the two second insulation layers opposite to the first insulation layer;
wherein a melting point of each of the at least one low-k dielectric layer is higher than a melting point of the first insulation layer.

2. The FFC according to claim 1, wherein the at least one shielding layer is a plurality of shielding layers, and each of the plurality of shielding layers comprises:
a metal layer, on one of the two second insulation layers opposite to the first insulation layer; and
an adhesive layer, bonding the metal layer and the second insulation layer that are adjacent.

3. The FFC according to claim 2, wherein each of the plurality of shielding layer further comprises:
a third insulation layer, on the metal layer opposite to the second insulation layer.

4. The FFC according to claim 2, wherein the adhesive layer is a dielectric adhesive layer.

5. The FFC according to claim 1, wherein the at least one shielding layer is a plurality of shielding layers, and each of the plurality of shielding layer comprises:
an external dielectric layer, on one of the two second insulation layers opposite to the first insulation layer;
a metal layer, on the external dielectric layer opposite to the second insulation layer; and
an adhesive layer, bonding the external dielectric layer and the metal layer that are adjacent.

6. The FFC according to claim 5, wherein each of the plurality of shielding layer further comprises:
a third insulation layer, on the metal layer opposite to the external dielectric layer.

7. The FFC according to claim 1, wherein the at least one shielding layer is a plurality of shielding layers, and each of the plurality of shielding layer comprises:
an external dielectric layer, on one of the two second insulation layers opposite to the first insulation layer;
a third insulation layer, on the external dielectric layer opposite to the second insulation layer;
an adhesive layer, bonding the external dielectric layer and the third insulation layer that are adjacent; and
a metal layer, on the third insulation layer opposite to the external dielectric layer.

8. The FFC according to claim 1, wherein the at least one shielding layer is two shielding layers, the two shielding layers are respectively located on the two second insulation layers opposite to the first insulation layer, and a width of each shielding layer is equal to that of the second insulation layer.

9. The FFC according to claim 1, wherein the at least one shielding layer is two shielding layers, the two shielding layers are respectively located on the two second insulation layers opposite to the first insulation layer, and a width of each shielding layer is less than a width of the corresponding second insulation layer.

10. The FFC according to claim 1, wherein the at least one shielding layer is two shielding layers, the two shielding layers are respectively located on the two second insulation layers relative to the first insulation layer, two opposite sides of each shielding layer exceeds the second insulation layer, and sections of the two shielding layers exceeding the second insulation layer fit with each other.

11. The FFC according to claim 1, wherein the at least one shielding layer is one shielding layer, and the two second insulation layers are surrounded with the at least one shielding layer.

12. The FFC according to claim 1, further comprising:
at least one second conductor, embedded in the first insulation layer, axially extending and arranged in parallel with the at least one pair of conductors, wherein the at least one pair of conductors and the at least one second conductor are arranged at intervals and in a way that their lateral positions are switched one for the other.

13. A signal transmission device, comprising:
an FFC according to claim 1; and
an electrical connection component, coupled to one end of the FFC.

14. A flexible flat cable (FFC), comprising:
a first insulation layer, being hot melt;
at least one pair of conductors, within the first insulation layer, where each of the at least one pair of conductors comprises a plurality of first conductors, and the plurality of first conductors are longitudinally extending and arranged in parallel;

at least one low-k dielectric layer, embedded within the first insulation layer, respectively corresponding to the at least one pair of conductors, wherein the plurality of first conductors in a same pair of the at least one pair of conductors are collectively and directly covered and surrounded with corresponding one of the at least one low-k dielectric layer, and wherein the first insulation layer is formed by fusing two first insulation layers;

two external dielectric layers, respectively on two surfaces of the first insulation layer; and two metal layers, respectively on the two external dielectric layers opposite to the first insulation layer;

wherein a melting point of each of the at least one low-k dielectric layer is higher than a melting point of the first insulation layer.

15. The FFC according to claim 14, further comprising:
two second insulation layers, respectively on the two metal layers opposite to the two external dielectric layers.

16. The FFC according to claim 14, further comprising:
at least one second conductor, embedded in the first insulation layer, axially extending and arranged in parallel with the at least one pair of conductors, wherein the at least one pair of conductors and the at least one second conductor are arranged at intervals and in a way that their lateral positions are switched one for the other.

17. A signal transmission device, comprising:
an FFC according to claim 14; and
an electrical connection component, coupled to one end of the FFC.

* * * * *